United States Patent
Kitano

(10) Patent No.: US 9,455,152 B2
(45) Date of Patent: Sep. 27, 2016

(54) HYDROGENATION METHOD AND HYDROGENATION APPARATUS

(75) Inventor: Katsuhisa Kitano, Osaka (JP)

(73) Assignee: Nissan Chemical Industries, Ltd., Tokyo (JP)

(*) Notice: Subject to any disclaimer, the term of this patent is extended or adjusted under 35 U.S.C. 154(b) by 26 days.

(21) Appl. No.: 14/235,055

(22) PCT Filed: Jul. 19, 2012

(86) PCT No.: PCT/JP2012/068301
§ 371 (c)(1),
(2), (4) Date: Jun. 30, 2015

(87) PCT Pub. No.: WO2013/015187
PCT Pub. Date: Jan. 31, 2013

(65) Prior Publication Data
US 2015/0294877 A1     Oct. 15, 2015

(30) Foreign Application Priority Data

Jul. 25, 2011     (JP) .................... 2011-162242

(51) Int. Cl.
*H01L 21/30*     (2006.01)
*H01L 21/02*     (2006.01)
(Continued)

(52) U.S. Cl.
CPC ..... *H01L 21/3003* (2013.01); *H01J 37/32192* (2013.01); *H01J 37/32348* (2013.01); *H01L 21/02532* (2013.01); *H01L 21/02592* (2013.01);
(Continued)

(58) Field of Classification Search
CPC ............ H01L 21/3003; H01L 21/02532; H01L 21/02592; H01L 21/02628; H01L 21/02664; H01L 37/32192; H01L 37/32348

USPC ................. 438/798, 488, 491, 511
See application file for complete search history.

(56) References Cited

U.S. PATENT DOCUMENTS 4,532,199 A * 7/1985 Ueno ................. C23C 16/24
                                                                 118/723 MR
5,464,710 A * 11/1995 Yang ................. G03H 1/02
                                                                 204/192.14

(Continued)

FOREIGN PATENT DOCUMENTS

JP     09-082637 A     3/1997
JP     2002-110992 A     4/2002

(Continued)

OTHER PUBLICATIONS

International Search Report; PCT/JP2012/068301; Oct. 23, 2012.
(Continued)

*Primary Examiner* — Karen Kusumakar
(74) *Attorney, Agent, or Firm* — Studebaker & Brackett PC

(57) ABSTRACT

A hydrogenation method according to the present invention includes preparing a plasma generation section (20), preparing a hermetic member (30), disposing an amorphous silicon film (S) inside the hermetic member (30), and performing plasma treatment on the amorphous silicon film (S) in a manner that the plasma generation section (20) allows a gas at a pressure around an atmospheric pressure containing a hydrogen gas to generate plasma in at least a partial region inside the hermetic member (30). Suitably, the disposing an amorphous silicon film (S) includes forming the amorphous silicon film (S) inside the hermetic member (30) with the use of a solution in which a silane compound is dissolved.

46 Claims, 29 Drawing Sheets

(51) Int. Cl.
*H01L 21/67* (2006.01)
*H01L 29/16* (2006.01)
*H05H 1/46* (2006.01)
*H05H 1/24* (2006.01)
*H01J 37/32* (2006.01)

(52) U.S. Cl.
CPC ... *H01L 21/02628* (2013.01); *H01L 21/02664* (2013.01); *H01L 21/67017* (2013.01); *H01L 21/67115* (2013.01); *H01L 29/1604* (2013.01); *H05H 1/2406* (2013.01); *H05H 1/46* (2013.01); *H05H 2001/2412* (2013.01); *H05H 2001/466* (2013.01); *H05H 2001/4607* (2013.01)

(56) References Cited

U.S. PATENT DOCUMENTS

| | | | | |
|---|---|---|---|---|
| 5,627,089 | A | * | 5/1997 | Kim ............ C23C 16/56 257/E21.101 |
| 5,662,819 | A | * | 9/1997 | Kadomura ........ C23F 4/00 216/68 |
| 6,680,577 | B1 | | 1/2004 | Inukai et al. |
| 6,827,987 | B2 | | 12/2004 | Won et al. |
| 7,061,186 | B2 | | 6/2006 | Inukai et al. |
| 7,886,688 | B2 | | 2/2011 | Takeuchi et al. |
| 7,886,689 | B2 | | 2/2011 | Takeuchi et al. |
| 2002/0009546 | A1 | * | 1/2002 | Koike ............ C23C 16/24 427/255.27 |
| 2003/0031792 | A1 | | 2/2003 | Won et al. |
| 2004/0164684 | A1 | | 8/2004 | Inukai et al. |
| 2008/0115892 | A1 | | 5/2008 | Takeuchi et al. |
| 2008/0193342 | A1 | | 8/2008 | Takeuchi et al. |
| 2009/0301864 | A1 | * | 12/2009 | Ohmi ............ C23C 16/30 204/192.15 |

FOREIGN PATENT DOCUMENTS

| | | |
|---|---|---|
| JP | 2002-167091 A | 6/2002 |
| JP | 2004-296729 A | 10/2004 |
| JP | 2007-180121 A | 7/2007 |
| JP | 2007-273716 A | 10/2007 |
| JP | 2010-056483 A | 3/2010 |
| JP | 2011-095776 A | 5/2011 |
| TW | 200618103 A | 6/2006 |
| TW | I257437 B | 7/2006 |
| TW | I291203 B | 12/2007 |
| WO | 2007/049402 A1 | 5/2007 |

OTHER PUBLICATIONS

An Office Action; Notice of Reasons for Rejection, issued by the Japanese Patent Office on Jun. 14, 2016, which corresponds to Japanese Patent Application No. 2013-525692 and is related to U.S. Appl. No. 14/235,055.

An Office Action issued by the Taiwanese Patent Office on Jul. 13, 2016, which corresponds to Taiwanese Patent Application No. 101126056 and is related to U.S Appl. No. 14/235,055.

* cited by examiner

HYDROGENATION METHOD AND HYDROGENATION APPARATUS

TECHNICAL FIELD

The present invention relates to hydrogenation methods and hydrogenation apparatuses.

BACKGROUND ART

Semiconductor devices including a silicon film have been widely used for electronic devices, such as display devices, controllers, etc. In general, monocrystalline silicon has high conductivity. Nevertheless, in view of cost and manufacturing processes, an amorphous silicon film or a polysilicon film is usually used as the semiconductor film. However, the amorphous silicon film, which has insufficiently conductivity, is subjected to annealing to improve the property in many cases.

Typically, it is known that thermal annealing is performed on the amorphous silicon film. In the thermal annealing, the amorphous silicon film is exposed to comparatively high temperatures to form the polysilicon film. In general, the amorphous silicon film is exposed to temperatures in the range from 600° C. to 1100° C. for several ten hours in the thermal annealing. It is noted that thermal annealing at a temperature of 500° C. or lower hardly provides effects, and therefore, it is difficult to perform the thermal annealing using a comparatively low-cost and excellently-processable substrate, such as a glass substrate and a plastic substrate, as a substrate for supporting the amorphous silicon film.

Further, laser annealing has been known as another annealing. The laser annealing is performed in such a manner that laser light is irradiated to the amorphous silicon film to form the polysilicon film. In general, the laser annealing can provide comparatively high energy partially to the amorphous silicon film, so that a substrate that supports the silicon film is not exposed to high temperatures as a whole. Accordingly, a glass substrate and a plastic substrate, which have comparatively low thermal resistance, can be used as the substrate.

The laser annealing uses a continuous wave laser or a pulsed laser. In the case using the continuous wave laser, such as an argon ion laser, a light beam having a spot with a diameter of about 100 µm is irradiated to the silicon film, thereby performing scan by the light beam on the silicon film. When irradiation of the light beam melts the silicon film, the silicon film is gradually solidified according to the energy distribution inside the light beam and movement of the light beam to cause crystallization of the silicon film. However, since the spot diameter of the light beam is small, it may take long time generally for the use of the continuous wave laser to thoroughly eliminate defects in the silicon film, which is comparatively wide.

On the other hand, in the case using the pulsed laser, such as an eximer laser, when laser light having comparatively high energy is irradiated to the silicon film, the silicon film is instantly melted. When the silicon film is solidified thereafter, the silicon film is crystallized. In the pulsed laser, while the spot diameter of the light beam can be increased comparatively large with comparatively high maximum energy of the laser light, the spot diameter of the light beam is still not so large relative to the silicon film. Accordingly, it may take long time to thoroughly eliminate defects of a comparatively large area of the silicon film. Further, when the spot diameter is increased simply in order to shorten the period of time, thermal damage to the substrate may accordingly increase. In this case, the use of a substrate with a thickness of smaller than 1 mm, which has been recently employed in general, may cause thermal damage to deform the substrate.

Besides the thermal annealing and the laser annealing, hydrogen plasma treatment has been known as a scheme for defect elimination (see Patent Literature 1). The hydrogen plasma treatment disclosed in Patent Literature 1 is performed on an amorphous silicon film under low pressures (e.g., 150 mTorr). This may terminate dangling bonds of the amorphous silicon film with hydrogen to eliminate bonding defects.

CITATION LIST

Patent Literature

[Patent Literature 1] Japanese Patent Application Laid-Open Publication No. 9-82637

SUMMARY OF INVENTION

Technical Problem

When the hydrogen plasma treatment as described in PTL 1 is performed, hydrogen ions with small atomic weight may have comparatively high kinetic energy to cause physical damage to the amorphous silicon film.

The present invention has been made in view of the foregoing and has its object of providing a hydrogenation method and a hydrogenation apparatus suitable for defect elimination.

Solution to Problem

A hydrogenation method according to the present invention includes: preparing a plasma generation section; preparing a hermetic member; disposing an amorphous silicon film inside the hermetic member; and performing plasma treatment on the amorphous silicon film in a manner that the plasma generation section allows a gas at a pressure around an atmospheric pressure containing a hydrogen gas to generate plasma in at least a partial region inside the hermetic member.

In one embodiment, the disposing an amorphous silicon film includes forming the amorphous silicon film inside the hermetic member with the use of a solution in which a silane compound is dissolved.

In one embodiment, the method further includes disposing the plasma generation section inside the hermetic member.

In one embodiment, the method further includes supplying the gas containing the hydrogen gas to the hermetic member.

In one embodiment, the supplying the gas is performed after the amorphous silicon film is disposed.

In one embodiment, the supplying the gas is performed before the amorphous silicon film is disposed, and the disposing an amorphous silicon film includes forming the amorphous silicon film inside the hermetic member to which the gas containing the hydrogen gas is supplied.

In one embodiment, the disposing an amorphous silicon film includes forming the amorphous silicon film inside the hermetic member with the use of the solution in which the silane compound is dissolved after the gas containing the hydrogen gas is supplied, and in the performing plasma treatment, the plasma is allowed to be generated without changing the gas inside the hermetic member at the time when the amorphous silicon film is formed.

In one embodiment, the method further includes performing temporary baking on the amorphous silicon film.

In one embodiment, in the performing plasma treatment, the gas is a mixed gas containing the hydrogen gas and an inert gas.

In one embodiment, in the mixed gas, the hydrogen gas has a concentration of 0.1 weight % or higher.

In one embodiment, the mixed gas contains a gas containing a p-type impurity element or an n-type impurity element.

In one embodiment, the mixed gas contains any of diborane, phosphine, and arsine.

In one embodiment, in the preparing a plasma generation section, the plasma generation section includes a first electrode and a second electrode.

In one embodiment, in the preparing a plasma generation section, one of the first electrode and the second electrode is grounded.

In one embodiment, in the preparing a plasma generation section, the amorphous silicon film is disposed between the first electrode and the second electrode.

In one embodiment, in the performing plasma treatment, the amorphous silicon film is moved so as to pass between the first electrode and the second electrode in generating the plasma.

In one embodiment, the performing plasma treatment includes sliding the amorphous silicon film so as to pass between the first electrode and the second electrode.

In one embodiment, in the performing plasma treatment, the plasma is generated between the first electrode and the second electrode in a state where the gas inside the hermetic member flows so as to pass between the first electrode and the second electrode and reach the amorphous silicon film.

In one embodiment, at least one of the first electrode and the second electrode is a linear electrode including two or more conductive parts extending in stripes, and the conductive parts have a bulk shape or a mesh-like shape.

In one embodiment, in the preparing a plasma generation section, a dielectric is mounted at at least one of the first electrode and the second electrode.

In one embodiment, the dielectric is made of an inorganic material or an organic material.

In one embodiment, the inorganic material includes glass, alumina, or apatite.

In one embodiment, the organic material includes polyimide, polyoxymethylene, or novolac resin.

In one embodiment, at least one of the first electrode and the second electrode is a linear electrode including two or more conductive parts extending in stripes.

In one embodiment, the conductive parts have a bulk shape or a mesh-like shape.

In one embodiment, in the preparing a plasma generation section, the dielectric is mounted at one of the first electrode and the second electrode.

In one embodiment, the second electrode is grounded. The dielectric includes a dielectric plate mounted at the first electrode. The first electrode is arranged opposite to the second electrode with the dielectric plate interposed therebetween.

In one embodiment, either the first electrode or the second electrode is disposed 0.5 mm or more apart from the amorphous silicon film.

In one embodiment, in the preparing a plasma generation section, the dielectric includes a first dielectric mounted at the first electrode and a second dielectric mounted at the second electrode.

In one embodiment, the first dielectric includes a first dielectric plate, and the second dielectric includes a second dielectric plate. The second electrode is grounded. A spacer made of a dielectric material is provided between the first dielectric plate and the second dielectric plate. The amorphous silicon film is disposed 0.5 mm or more apart from the first dielectric plate.

In one embodiment, the first electrode includes a rod-shaped electrode surrounded by and covered with the first dielectric. The first dielectric is made of an organic insulating material. The second electrode includes a metal plate or a metal mesh fixed at the bottom of the second dielectric. The second electrode is grounded. The amorphous silicon film is disposed between the first electrode and the second electrode. The amorphous silicon film is arranged 0.5 mm or more apart from the first electrode.

In one embodiment, the second electrode is grounded. The dielectric is mounted at only the first electrode. The first electrode is arranged opposite to the second electrode with the dielectric interposed therebetween.

In one embodiment, the first electrode and the second electrode are disposed on the dielectric, and each of the first electrode and the second electrode is covered with an organic material.

In one embodiment, the first electrode is arranged opposite to the second electrode with no dielectric interposed therebetween.

In one embodiment, the performing plasma treatment includes applying alternating voltage between the first electrode and the second electrode.

In one embodiment, the alternating voltage is 25 volts or higher and 100 kilovolts or lower and has a frequency of 60 hertz or higher and 1 megahertz or lower.

In one embodiment, the alternating voltage has a waveform of any of a sine wave, a triangular wave, and a rectangular wave.

In one embodiment, the performing plasma treatment includes heating the amorphous silicon film with a heater.

In one embodiment, the performing plasma treatment includes setting the amorphous silicon film in a range between minus 30° C. and 900° C.

In one embodiment, in the performing plasma treatment, a crystalline state of the amorphous silicon film is controlled according to an ionized gas density.

In one embodiment, in the preparing a plasma generation section, the plasma generation section includes a coil.

In one embodiment, in the preparing a plasma generation section, the plasma generation section includes a microwave generation section and an antenna.

A hydrogenation apparatus according to the present invention includes: a plasma generation section; and a hermetic member, wherein the plasma generation section allows a gas at a pressure around an atmospheric pressure containing a hydrogen gas to generate plasma in at least a partial region inside the hermetic member.

In one embodiment, the plasma generation section includes a first electrode and a second electrode.

In one embodiment, the plasma generation section includes a coil.

In one embodiment, the plasma generation section includes a microwave generation section and an antenna.

Advantageous Effects of Invention

According to the present invention, a hydrogenation method and a hydrogenation apparatus can be provided which are suitable for elimination of bonding defects.

DESCRIPTION OF EMBODIMENTS

Embodiments of a hydrogenation method and a hydrogenation apparatus according to the present invention will be described below with reference to the accompanying drawings. It is noted that the present invention is not limited to the following embodiments.

First of all, one embodiment of a hydrogenation apparatus and a hydrogenation method according to the present invention will be described with reference to FIGS. 1 and 2.

Figure 1:
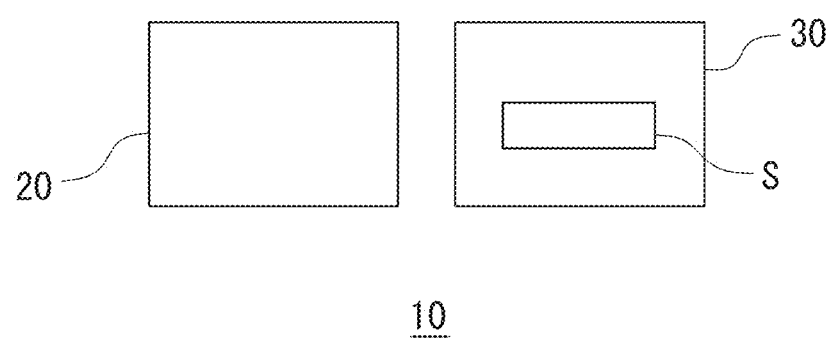
FIG. 1 is a schematic illustration of one embodiment of a hydrogenation apparatus according to the present invention.

FIG. 1 is a schematic illustration showing the hydrogenation apparatus 10 according to the present embodiment. The hydrogenation apparatus 10 includes a plasma generation section 20 and a hermetic member 30. The inside of the hermetic member 30 is sealed so as to shut off the air outside the hermetic member 30. It is noted that although the plasma generation section 20 is arranged outside the hermetic member 30 in FIG. 1, the plasma generation section 20 may be arranged inside the hermetic member 30.

Further, herein, an amorphous silicon film (non-crystalline silicon film) S is disposed inside the hermetic member 30. Dangling bonds are present in the amorphous silicon film S. Although details will be described later, the plasma generation section 20 of the hydrogenation apparatus 10 in the present embodiment allows, in the presence of a gas at a pressure around the atmospheric pressure containing a hydrogen gas in at least a partial region inside the hermetic member 30, the gas at a pressure around the atmospheric pressure containing the hydrogen gas to generate plasma. Generation of plasma causes ionization of at least part of the hydrogen gas to generate hydrogen ions. When the hydrogen ions reach the amorphous silicon film S, the dangling bonds of the amorphous silicon film S terminate, thereby eliminating bonding defects. Plasma treatment is performed in this manner.

Figure 2A:
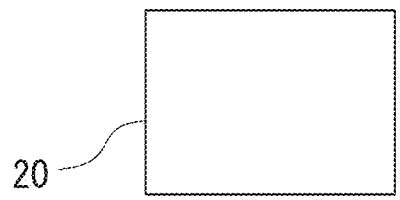
FIGS. 2A-2D are schematic illustrations for explaining one embodiment of a hydrogenation method according to the present invention.

A hydrogenation method according to the present embodiment will be described with reference to FIG. 2. As shown in FIG. 2A, the plasma generation section 20 is prepared first. The plasma generation section 20 is capable of applying an electric field or an electromagnetic field.

Figure 2B:
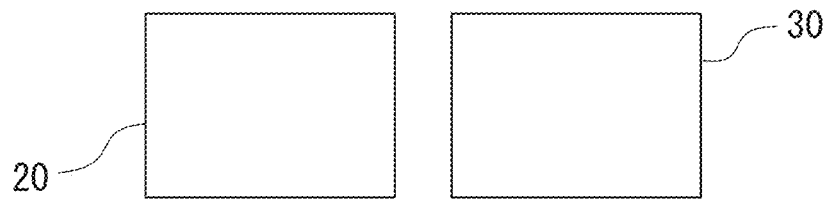

As shown in FIG. 2B, the hermetic member 30 is prepared. In order that the plasma generation section 20 allows plasma to be generated in the presence of the gas at a pressure around the atmospheric pressure containing the hydrogen gas, the hermetic member 30 is sealed so as not to allow the air outside the hermetic member 30 to be directly mixed. The hermetic member 30 may be generally called a chamber or a glove box capable of maintaining its shape even when the inside thereof is vacuumed (strictly, reduced in pressure). Or, the hermetic member 30 may allow a gas to pass through the inside thereof as fluid. For example, the hermetic member 30 may be tubular in shape.

Figure 2C:
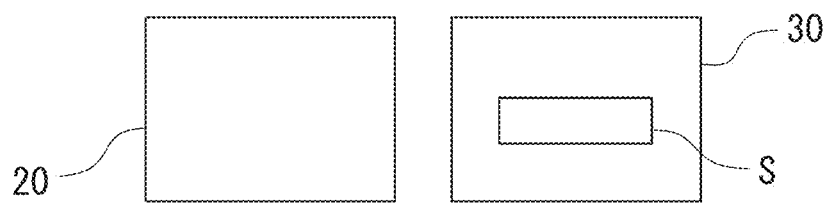

As shown in FIG. 2C, the amorphous silicon film S is placed inside the hermetic member 30. The amorphous silicon film S is supported by a substrate, for example. The amorphous silicon film S may be placed at a position where the electric field or the electromagnetic filed is applied by the plasma generation section 20. Alternatively, it may be placed at a position apart from the position where the electric field or the electromagnetic filed is applied by the plasma generation section 20.

Figure 2D:
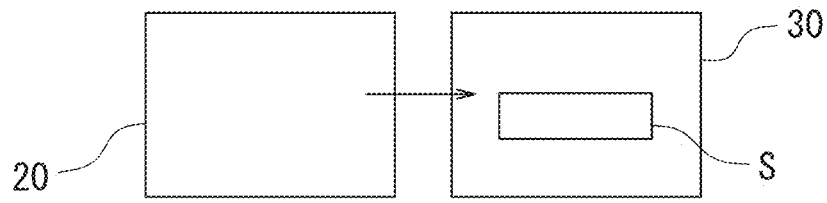

As shown in FIG. 2D, the plasma generation section 20 allows the gas at a pressure around the atmospheric pressure containing the hydrogen gas to generate plasma in at least a partial region inside the hermetic member 30. The plasma treatment can be performed in this manner.

According to the present embodiment, bonding defects of the amorphous silicon film S can be easily eliminated. The hydrogenation can be recognized by secondary ion mass spectrometry, Raman spectroscopy, or electron spin resonance. Further, according to the present embodiment, plasma is generated when the gas containing the hydrogen gas is at a pressure around the atmospheric pressure. This can suppress an increase in kinetic momentum of the hydrogen ions, thereby reducing physical damage to the amorphous silicon film S. Furthermore, since the partial pressure of the hydrogen gas can be comparatively high, the hydrogenation can be performed within a comparatively short period of time. In addition, plasma is generated at a pressure around the atmospheric pressure. This can easily avoid batch treatment.

As described above, the pressure of the gas containing the hydrogen gas in generating plasma is around the atmospheric pressure. For example, the pressure of the gas containing the hydrogen gas is 0.1 atm or higher and 2 atm or lower, and preferably roughly 1 atm (101325 Pa).

It is noted that the higher the ratio of the hydrogen gas is, the more efficiently the number of hydrogen ions at plasma generation increases. In view of this, it is preferable that the gas to which the electric or electromagnetic field is applied in the hermetic member 30 contains only the hydrogen gas. However, another gas may be contained in the gas to which the electric or electromagnetic field is applied, in addition to the hydrogen gas. Further, the gas containing hydrogen may be supplied to the hermetic member 30 in the presence of another gas in the hermetic member 30. The supplied gas may be the hydrogen gas only or a gas containing another gas in addition to the hydrogen gas.

In the case where the gas to which the electric or electromagnetic field is applied by the plasma generation section 20 contains another gas in addition to the hydrogen gas, preferably, the gas other than the hydrogen gas contained in the mixed gas does not adversely affect the property of the amorphous silicon film S. For example, the mixed gas may contain an inert gas in addition to the hydrogen gas. The inert gas may be, for example, a rare gas included in Group 18 elements, such as helium, neon, argon, krypton, etc. Further, a nitrogen gas may be used as the inert gas. A plurality of the above mentioned rare gases may be mixed in combination as the inert gas contained in the mixed gas. The concentration of the hydrogen gas in the mixed gas is preferably 0.1 weight % or higher. It is noted that the mixed gas preferably contains no oxygen gas.

Moreover, the mixed gas may contain a gas containing a p-type or n-type impurity element in place of the inert gas or in addition to the inert gas. Provision of such an impurity element to the amorphous silicon film S can result in control of the property of the amorphous silicon film S. For example, where the mixed gas contains diborane, a p-type amorphous silicon film can be formed. By contrast, where the mixed gas contains phosphine or arsine, an n-type amorphous silicon film can be formed.

It is noted that in order to provide an impurity element in a silicon film by ion implantation, it is generally necessary to perform additional annealing after ion implantation using a comparatively expensive ion implantation apparatus. By contrast, in the present embodiment, no ion implantation apparatus is necessary. Further, the impurity element is provided in the amorphous silicon film S at plasma generation, which can mean that additional annealing is unnecessary.

The gas containing the hydrogen gas at a pressure around the atmospheric pressure generates plasma in the chamber 30 in which the amorphous silicon film S is provided in the present embodiment. For example, a predetermined gas containing the hydrogen gas may be supplied after the atmosphere (the air) inside the chamber 30 is once removed. Alternatively, the amorphous silicon film S may be formed in the chamber 30 after the predetermined gas is supplied into the chamber 30 up to the time when the pressure becomes around the atmospheric pressure. Or, the predetermined gas may be supplied into the chamber 30 so that the pressure becomes around the atmospheric pressure after the amorphous silicon film S is placed inside the chamber 30. It is noted that in the case where the amorphous silicon film S is formed after the predetermined gas is supplied, the plasma may be generated immediately after formation of the amorphous silicon film S without substantial gas change in the chamber 30.

As described above, the plasma generation section 20 generates the electric or electromagnetic field. The electric current flowing in the plasma generation section 20 may be direct current or alternating current. For example, it is preferable that the frequency of the electric current is zero or higher and 2.45 GHz or lower. The frequency of the electric current is further preferably 50 Hz or higher and 100 MHz or lower, and more preferably 1 kHz or higher and 100 kHz or lower. The alternating voltage may have a waveform of any of a sine wave, a triangular wave, and a rectangular wave. For example, in the case using the rectangular wave, the plasma can be generated sufficiently at a duty ratio of 1% or higher. It is noted that the duty ratio is preferably 5% or higher, and more preferably 25% or higher.

The ionized gas density at plasma generation varies depending on the electric current and its frequency in the plasma generation section 20. Typically, where ionization of a gas is performed at the atmospheric pressure, the higher the alternating voltage or the frequency is, the more the ionized gas density increases, thereby performing stable ionization. However, the discharge state varies depending not only on the voltage and the frequency but also on the structure of the plasma generation section 20, the gas to which the electric or electromagnetic field is applied, etc.

Moreover, the electron temperature is different from the ion temperature depending on ionized gas density. For example, where the degree of ionization is low (weakly ionized state), neutral molecules are dominant even where plasma is generated. This plasma may be called weakly ionized plasma or low temperature plasma. It is noted that the mass of the ions are markedly different from that of electrons, and therefore, energy exchange hardly occurs even if ions collide with electrons. For this reason, the electron temperature is different from the ion temperature in the weakly ionized state. For example, the ion temperature is around the room temperature, while the electron temperature is about several thousand degrees to ten thousand degrees. Where the gas is in a state of ionized gas, the gas does not have enough energy to increase the temperature of the substrate that supports the amorphous silicon film S. Accordingly, the substrate can be handled at low temperatures. Thus, a glass substrate or a plastic substrate can be used as the substrate that supports the amorphous silicon film S.

It is noted that an increase in degree of ionization reduces the ratio of the neutral molecules. A further increase in degree of ionization results in almost all gaseous molecules ionized. That is, almost all part of the gas is composed of the ions and the electrons. This plasma may be called fully ionized plasma or high temperature plasma. In this case, the electron temperature increases to several ten thousand degrees or higher, and the ion temperature also increases.

As can be understood from the foregoing, control of the plasma to be generated can control the temperature of the substrate that supports the amorphous silicon film S. For example, in crystallization of the amorphous silicon film S, when the electron temperature is set comparatively high, the temperature of the surface of the amorphous silicon film S can be increased to perform annealing. By contrast, when the ion temperature is set comparatively low, variation in internal temperature of the amorphous silicon film S and of the support member thereof can be reduced. It is noted that to say the least in theory, the electron temperature and the ion temperature can be controlled in the range from the room temperature to the temperature of the surface of the sun. Further, for example, when the ionized gas is set in the form of uniform plane, stripes, or torch, the substrate that supports the amorphous silicon film S can have any corresponding shape, and the temperature of the substrate can be controlled.

Furthermore, by the hydrogenation method according to the present embodiment, control of the ionized gas density can set the electron temperature to be equal to or higher than one hundred thousand degrees and can keep the temperature of part where the hydrogenation is performed comparatively low. However, in order to increase the processing speed, plasma may be generated with the temperature of the substrate increased using a heater (not shown), such as a hotplate or the like. In this case, the crystallization state can be controlled, while bonding defects can be eliminated. The temperature of the substrate at plasma generation is preferably set in the range from minus 30° C. to 900° C. Although it depends on the thickness of the substrate, the temperature of the substrate at plasma generation is preferably set at 300° C. or lower, and more preferably at 250° C. or lower.

Where the plasma is generated in the vicinity of the plasma generation section 20, the amorphous silicon film S may be moved at plasma generation so as to pass in the vicinity of the plasma generation section 20. In this case, the amorphous silicon film S may be disposed on a slide part that passes in the vicinity of the plasma generation section 20 at plasma generation. In this manner, scanning of the amorphous silicon film S relative to the plasma generation section 20 can eliminate bonding defects in the amorphous silicon film S and can control the configuration thereof.

Further, in the case where the amorphous silicon film S is comparatively large, the plasma generation section 20 may be moved relative to the amorphous silicon film S. For example, the amorphous silicon film S may be moved with the plasma generation section 20 fixed. Alternatively, the plasma generation section 20 may be moved with the amorphous silicon film S fixed.

The amorphous silicon film S may be formed by chemical vapor deposition (CVD). Further, although details will be described later, the amorphous silicon film S may be formed by applying a solution in which a silane compound is dissolved. In this solution, silane-based oligomer or silane-based polymer is dissolved, for example. The solution of the silane compound is applied by spin coating or inkjetting, for example. Further, after the amorphous silicon film S is formed, temporary baking may be performed on the amorphous silicon film S before the plasma generation to remove residual solvent. Alternatively, light may be irradiated to the applied solution before the plasma generation. It is noted that the solution of the silane compound, which may be unstable in the air containing an oxygen gas, is preferably treated inside a globe box under a nitrogen atmosphere.

For example, a polymer with a five-membered ring may be used as the silane compound. Alternatively, polymer may be cross linked by irradiating ultraviolet light. Further, in this case, crosslinking of the polymer can be promoted by the plasma. However, when the ionized gas density is too high, silicon-to-silicon bonding may be broken to form dangling bonds. Accordingly, it is preferable to appropriately adjust the ionized gas density.

Moreover, according to the present embodiment, hydrogenation can be easily performed without using a comparatively expensive high vacuum system. Further, the hydrogenation apparatus in the present embodiment can generate thermal particles by increasing the ionized gas density, thereby achieving promotion of crystallization of the amorphous silicon film. Moreover, the hydrogenation in the present embodiment may be employed as annealing in place of the process of laser treatment. For example, in the case of manufacturing a thin film transistor as a semiconductor device, the present embodiment can efficiently eliminate bonding defects of the amorphous silicon film S and can promote crystallization of the amorphous silicon film S, thereby increasing the mobility.

Figure 3A:
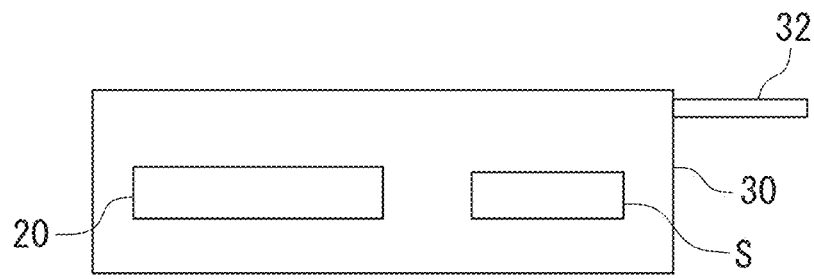
FIGS. 3A-3C are schematic illustrations each showing a hydrogenation apparatus according to one embodiment.

It is noted that the gas inside the hermetic member 30 may be supplied from the outside. For example, as shown in FIG. 3A, a gas supply pipe 32 may be mounted at the hermetic member 30 to fill the hermetic member 30 almost uniformly with the gas containing the hydrogen gas which is supplied from the gas supply pipe 32.

Figure 3B:
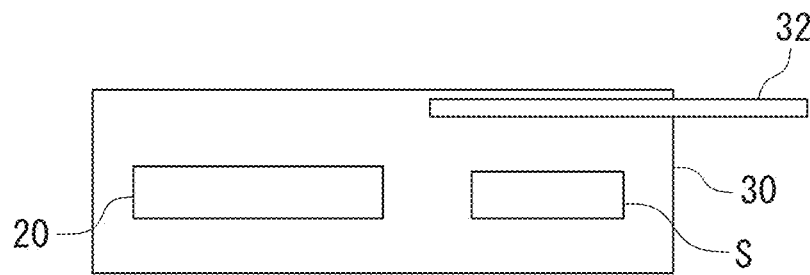

In addition, as shown in FIG. 3B, the end part of the gas supply pipe 32 may reach the inside of the hermetic member 30 to supply the gas containing the hydrogen gas so that the concentration of the hydrogen gas in the vicinity of the plasma generation section 20 becomes comparatively high. For example, the gas containing the hydrogen gas may be supplied locally to the plasma generation section 20 from the gas supply pipe 32 with the hermetic member 30 set almost in a nitrogen atmosphere as a whole so that the plasma generation section 20 allows the gas to generate plasma.

Figure 3C:
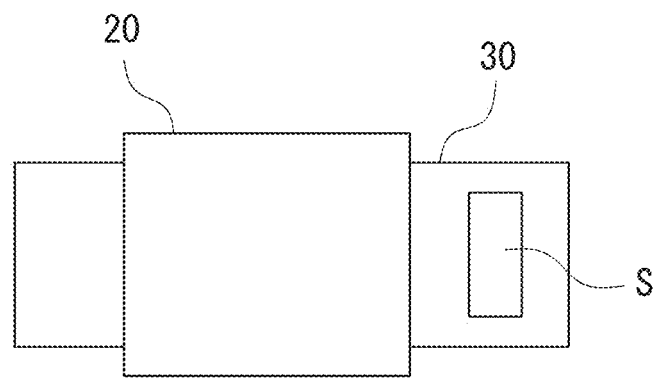

Moreover, as shown in FIG. 3C, the hermetic member 30 may be tubular in shape so that the gas containing the hydrogen gas passes inside the hermetic member 30. It is noted that the amorphous silicon film S herein is disposed inside the hermetic member 30, while the plasma generation section 20 is arranged outside the hermetic member 30.

One example of the hydrogenation apparatus 10 according to the present embodiment will be described below. It is noted that while the plasma generation section 20 herein allows plasma to be generated between two electrodes as one example, the plasma generation section 20 may generate plasma by any method.

Figure 4:
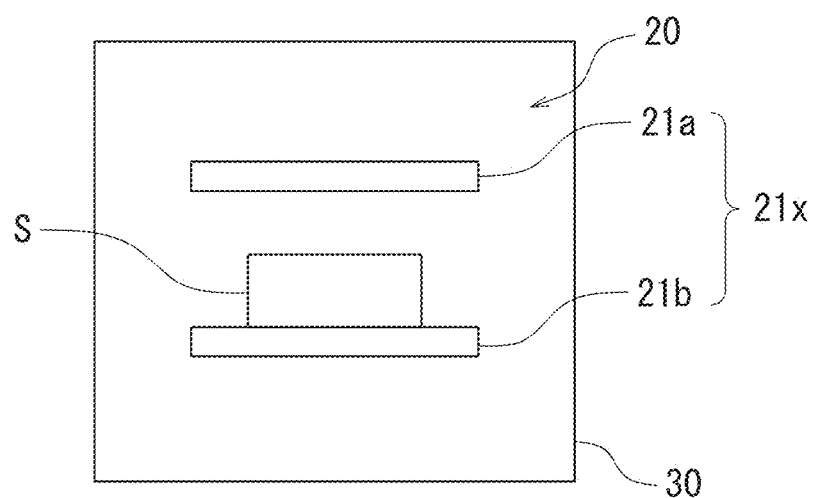
FIG. 4 is a schematic illustration of a hydrogenation apparatus according to one embodiment.

FIG. 4 is a schematic illustration of a hydrogenation apparatus 10 according to the present embodiment. In the hydrogenation apparatus 10 shown in FIG. 4, the plasma generation section 20 is arranged inside the hermetic member 30. For example, a chamber inside which space shut off from the outside air is used as the hermetic member 30. The plasma generation section 20 includes electrodes 21a, 21b. The amorphous silicon film S is disposed inside the chamber 30. For example, the electrodes 21a, 21b are each formed of a conductive member (e.g., metal). The electrodes 21a, 21b may have a plate-like shape or a specified shape. Alternatively, respective parts of the electrodes 21a, 21b may have a bulk shape or a mesh-like shape. In the following description of the present specification, the electrode 21a may be referred to as a first electrode 21a, and the electrode 21b may be referred to as a second electrode 21b.

The amorphous silicon film S is disposed between the electrode 21a and the electrode 21b herein. For example, the amorphous silicon film S may be disposed on the principal surface of the electrode 21a or 21b. In the hydrogenation apparatus 10, voltage is applied between the electrode 21a and the electrode 21b in the state when the gas containing the hydrogen gas is set at a pressure around the atmospheric pressure in the chamber 30. This generates ionized gas in the chamber 30. In the following description of the present specification, the electrode 21a and the electrode 21b may be referred collectively to an ionized gas generation section 21x.

Hereinafter, a hydrogenation method according to the present embodiment will be described with reference to FIG. 5.

Figure 5A:
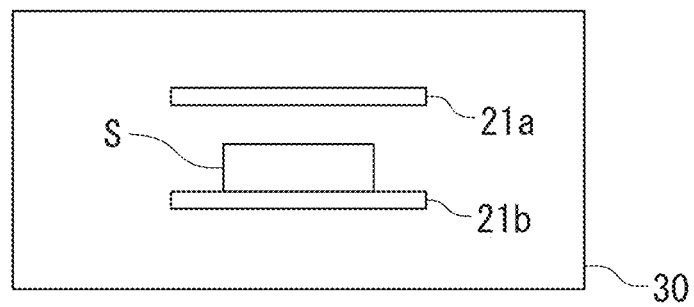
FIGS. 5A and 5B are schematic illustrations for explaining one embodiment of a hydrogenation method according to the present invention.

First, as shown in FIG. 5A, the chamber 30 is prepared. Inside the chamber 30, the electrodes 21a, 21b and the amorphous silicon film S are disposed. Here, the amorphous silicon film S is disposed on the principal surface of the electrode 21b. The amorphous silicon film S may be supported by another member (not shown), such as a substrate. Dangling bonds are present in the amorphous silicon film S.

Figure 5B:
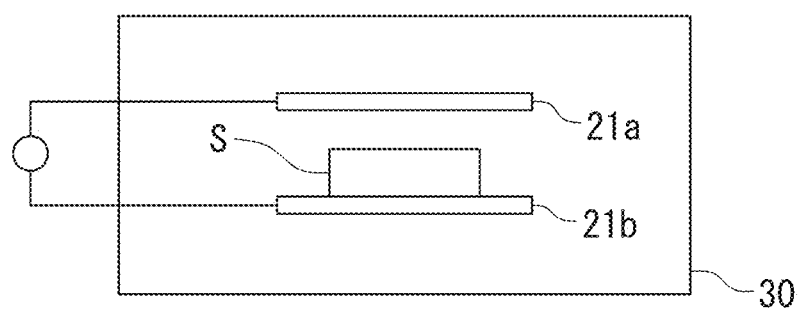

As shown in FIG. 5B, the gas containing the hydrogen gas is set at a pressure around the atmospheric pressure in the chamber 30. Under this state, voltage is applied between the first electrode 21a and the second electrode 21b, thereby generating plasma. At least part of the hydrogen gas in the chamber 30 is ionized by the plasma generation. When the hydrogen ions reach the amorphous silicon film S, the dangling bonds of the amorphous silicon film S terminate to eliminate bonding defects. It is noted that the oxygen concentration in the chamber 30 is preferably low at plasma generation. Further, it is preferable to once set the inside of the chamber 30 to be in an almost vacuum state before the gas containing the hydrogen gas is supplied to the chamber 30.

For example, in the hydrogenation apparatus 10 according to the present embodiment, alternating voltage is applied between the electrodes 21a and 21b. For example, one of the electrodes 21a, 21b may be grounded, while the potential of the other electrode 21a or 21b only may vary. For example, the alternating voltage may be supplied to the electrode 21a, while the electrode 21b is grounded. For example, where the alternating voltage is 100 kilovolts or lower, and its frequency is 100 kilohertz or lower, the state of low temperature plasma can be easily achieved, thereby suppressing an increase in temperature of the amorphous silicon film and its support member.

The alternating voltage is preferably 100 kilovolts or lower. The alternating voltage is preferably 25 volts or higher and 100 kilovolts or lower, more preferably 1 kilovolts or higher and 100 kilovolts or lower, further preferably 1 kilovolts or higher and 50 kilovolts or lower, and even more preferably 1 kilovolt or higher and 20 kilovolts or lower.

Furthermore, the frequency of the alternating voltage is preferably 60 hertz or higher and 1 megahertz or lower. Specifically, the frequency of the alternating voltage is preferably 100 kilohertz or lower, more preferably 1 kilohertz or higher and 100 kilohertz or lower, further preferably 1 kilohertz or higher and 50 kilohertz or lower, and even more preferably 1 kilohertz or higher and 20 kilohertz or lower. It is noted that when the alternating voltage and its frequency are low, stable plasma may not be generated. However, when the voltage and the frequency are lowered to target values after the alternating current is set at high voltage and high frequency to generate plasma once, stable plasma can be generated comparatively easily at comparatively low alternating voltage and frequency.

The ionized gas density at plasma generation varies according to the alternating voltage applied to the electrodes 21a, 21b and its frequency. Typically, in the case where the gas is ionized at the atmospheric pressure, the higher the alternating voltage or frequency is, the more the ionized gas density increases, thereby performing stable ionization. It should be noted, however, the discharge state varies depending not only the alternating voltage and the frequency but also the structure of the electrodes 21a, 21b, the distance between the electrodes 21a, 21b, the gas in the chamber 30, etc.

The amorphous silicon film S is disposed at the position where the electric or electromagnetic field is applied by the plasma generation section 20 in the hydrogenation apparatus 10 shown in FIG. 4. The hydrogenation is performed on the amorphous silicon film S by the plasma generated using the plasma generation section 20. This plasma may be called direct plasma. It is noted that although not described in detail herein, the amorphous silicon film S may be disposed at a position other than the position where the electric or electromagnetic field is applied by the plasma generation section 20. In this case, the hydrogenation is performed on the amorphous silicon film S also by the plasma generated using the plasma generation section 20. This plasma may be called remote plasma.

Where the plasma is generated in the vicinity between the electrode 21a and the electrode 21b, the amorphous silicon film S may be moved at plasma generation so as to pass between the electrodes 21a and the electrode 21b. In this case, the amorphous silicon film S may be placed on a slide part that passes between the electrode 21a and the electrode 21b at plasma generation. Thus, scanning of the amorphous silicon film S relative to the electrodes 21a, 21b can eliminate bonding defects in the amorphous silicon film S and can control the configuration.

Moreover, where the amorphous silicon film S is comparatively large, the electrodes 21a, 21b may be moved relative to the amorphous silicon film S. For example, the amorphous silicon film S may be moved with the electrodes 21a, 21b fixed. Alternatively, the electrodes 21a, 21b may be moved with the amorphous silicon film S fixed.

It is noted that in the hydrogenation apparatus 10 shown in FIG. 4, the electrodes 21a, 21b are arranged opposite to each other inside the chamber 30, thereby achieving comparatively high ionized gas density. However, this does not limit the present invention. A dielectric may be provided between the electrodes 21a, 21b, as needed.

Figure 6:
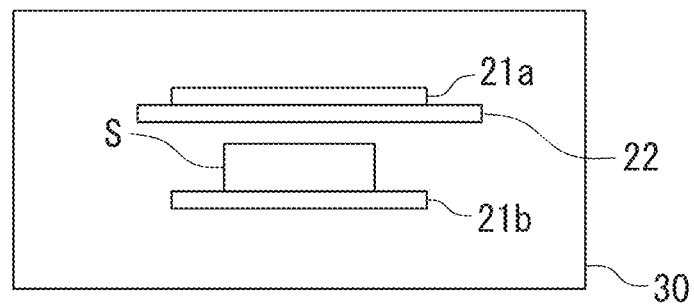
FIG. 6 is a schematic illustration of one embodiment of a hydrogenation apparatus according to the present invention.

FIG. 6 is a schematic illustration of a hydrogenation apparatus 10 according to one embodiment. In this hydrogenation apparatus 10, a dielectric 22 is provided between the electrode 21a and the electrode 21b. For example, the dielectric 22 is made of glass. With the use of the dielectric 22, low temperature plasma can be easily realized.

The dielectric 22 has a thickness of preferably 0.1 mm or larger, more preferably 1 mm or larger, and even more preferably 3 mm or larger. The dielectric 22 is made of an ordinary material with no conductivity. The dielectric 22 may be made of an inorganic material or an organic material. For example, the dielectric 22 may be made of an inorganic material, such as aluminum oxide, silicon oxide, silicon nitride, etc. Further, examples of the inorganic material include glass, alumina, and apatite. Alternatively, the dielectric 22 may be made of an organic material, such as silicon resin, phenol resin, polyimide resin, polytetrafluoroethylene, etc. Further, examples of the organic material include polyimide, polyoxymethylene, and novolac resin. Alternatively, insulating metal oxide may be used as a material of the dielectric 22. For example, an aluminum oxide (alumina) plate may be used as the dielectric 22.

One of the electrodes 21a, 21b may be mounted at the dielectric 22. For example, the electrode 21a may be mounted at the dielectric 22. The principal surface of the dielectric 22 may be larger than that of each electrode 21a, 21b, and the dielectric 22 may have a plate-like shape. Further, the electrode 21a may be formed of a metal mesh or a metal plate. For example, the electrode 21a is attached to the dielectric 22 so as not to extend beyond the dielectric 22, and the electrode 21a is arranged opposite to the electrode 21b with the dielectric 22 interposed therebetween. The electrode 21a is attached to the dielectric 22 by means of an insulating tape.

It is noted that in order to prevent abnormal discharge, it is preferable to set the distance between the amorphous silicon film S and the electrode 21a not to be too short. For example, it is preferable to dispose the amorphous silicon film S 0.5 mm or more apart from the electrode 21a.

Referring to the hydrogenation apparatus 10 shown in FIG. 6, the electrode 21a is mounted at the dielectric 22, but the present invention is not limited to this arrangement. The electrodes 21a, 21b may be mounted at dielectrics.

Figure 7A:
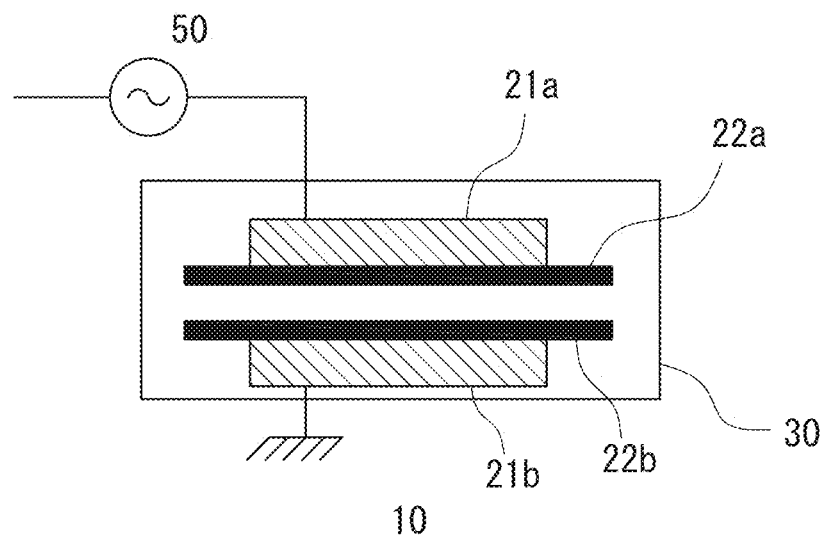
FIG. 7A is a schematic illustration showing a hydrogenation apparatus according to one embodiment.
Figure 7B:
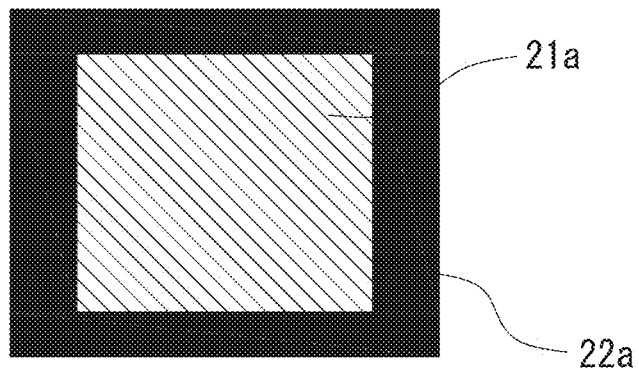
FIG. 7B is a schematic illustration of a discharge electrode of the hydrogenation apparatus shown in FIG. 7A as viewed from above.
Figure 7C:
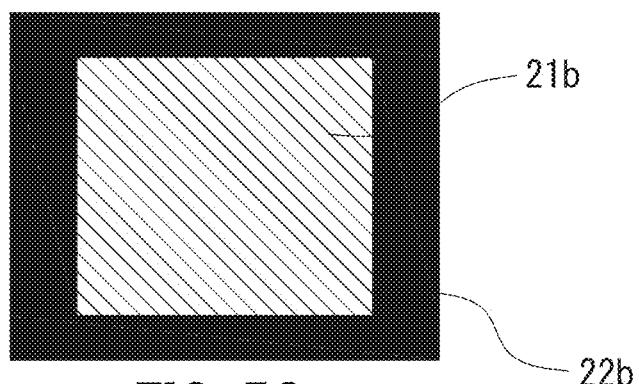
FIG. 7C is a schematic illustration of a ground electrode of the hydrogenation apparatus shown in FIG. 7A as viewed from below.

With reference to FIG. 7, a hydrogenation apparatus 10 will be described which includes dielectrics 22a, 22b at which electrodes 21a, 21b are mounted, respectively. FIG. 7A is a schematic illustration of the hydrogenation apparatus 10. FIG. 7B is a schematic illustration of the electrode 21a as viewed from above. FIG. 7C is a schematic illustration of the electrode 21b as viewed from below. The electrode 21a is mounted at the dielectric 22a, while the electrode 21b is mounted at the dielectric 22b.

The dielectric 22a is arranged opposite to the dielectric 22b, and the electrodes 21a, 21b are arranged outward of the dielectrics 22a, 22b, respectively. Though not shown herein, the amorphous silicon film S is disposed on the principal surface other than the principal surface of the dielectric 22b at which the electrode 21b is mounted so as to be overlap with the electrode 21b.

Here, the electrodes 21a, 21b are arranged so as to be different in height from the ground (i.e., in vertical direction). The electrode 21b located below is grounded. To the electrode 21a, electric current is supplied through a lead wire from a power source 50 installed outside the chamber 30. In the present specification, the grounded electrode 21b may be referred to as a ground electrode, while the other electrode 21a may be referred to as a discharge electrode.

For example, the electrodes 21a, 21b may be mounted at the dielectrics 22a, 22b so as not to extend beyond the dielectrics 22a, 22b, respectively, and the dielectric 22a, 22b may be arranged opposite to each other in the direction where the electrodes 21a, 21b are not opposed to each other. For example, aluminum oxide substrates may be used as the dielectrics 22a, 22b. For example, each principal surface of the aluminum oxide substrates 22a, 22b is nearly square in shape with a length of about 10 cm and has a thickness of about 0.5 mm. For example, square stainless meshes with a length of 5 cm are used as the electrodes 21a, 21b, and the stainless meshes 21a, 21b are attached to the aluminum oxide substrates 22a, 22b, respectively, by means of an insulating tape.

It is noted that the distance between the dielectrics 22a, 22b is set according to the thickness of the dielectrics 22a, 22b and the voltage applied between the electrodes 21a, 21b. The distance between the dielectrics 22a, 22b is preferably 1 mm or larger in order to avoid short-circuit discharge.

Figure 8A:
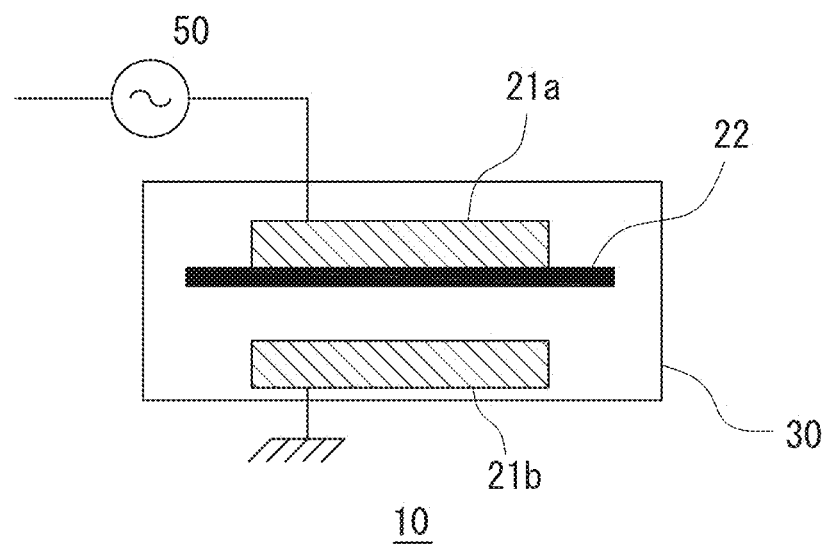
FIG. 8A is a schematic illustration of a hydrogenation apparatus according to one embodiment.
Figure 8B:
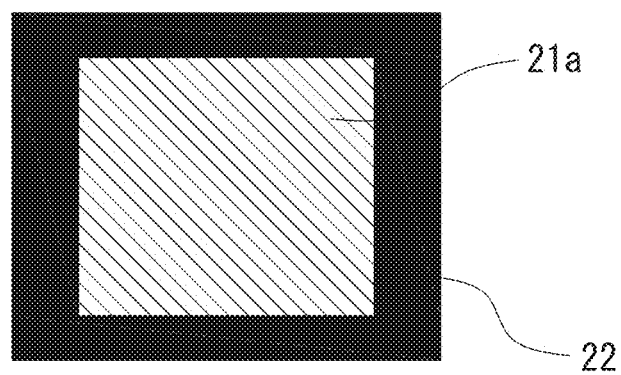
FIG. 8B is a schematic illustration of a discharge electrode of the hydrogenation apparatus shown in FIG. 8A as viewed from above.
Figure 8C:
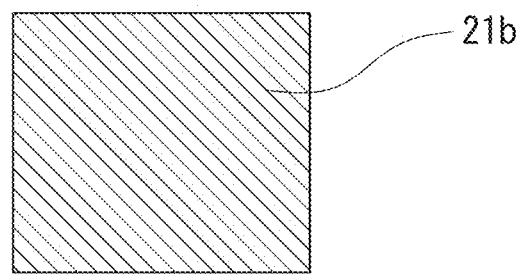
FIG. 8C is a schematic illustration of a ground electrode of the hydrogenation apparatus shown in FIG. 8A as viewed from below.
Figure 9A:
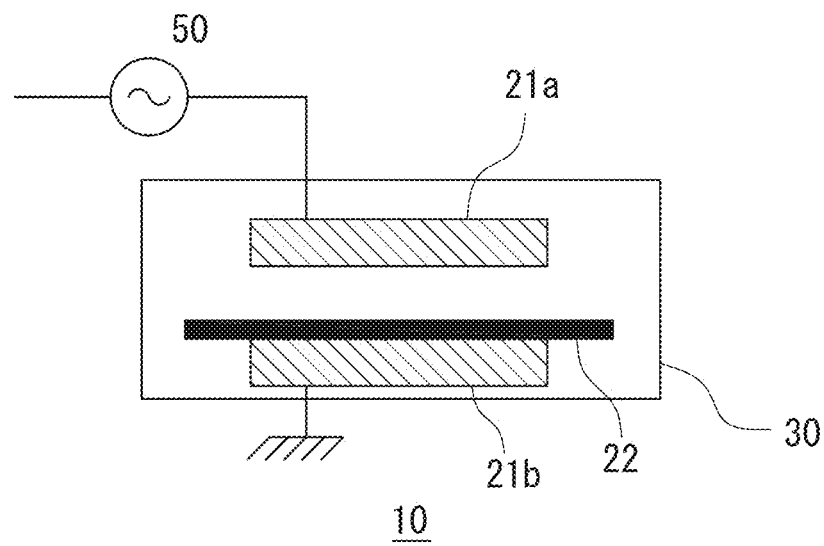
FIG. 9A is a schematic illustration showing a hydrogenation apparatus according to one embodiment.
Figure 9B:
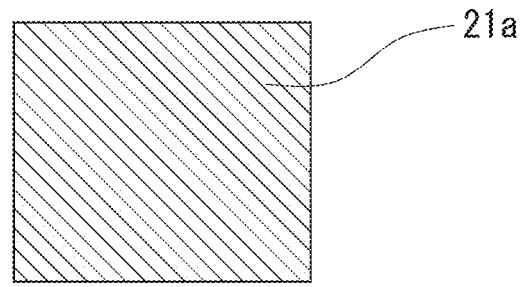
FIG. 9B is a schematic illustration of a discharge electrode of the hydrogenation apparatus shown in FIG. 9A as viewed from above.
Figure 9C:
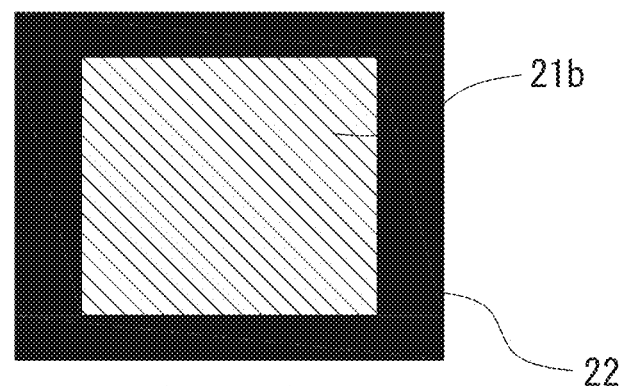
FIG. 9C is a schematic illustration of a ground electrode of the hydrogenation apparatus shown in FIG. 9A as viewed from below.
Figure 10A:
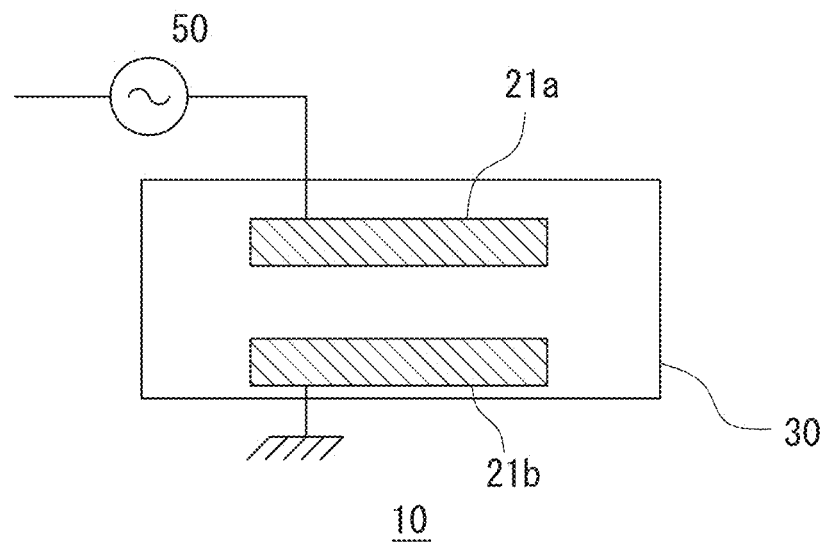
FIG. 10A is a schematic illustration showing a hydrogenation apparatus according to one embodiment.
Figure 10B:
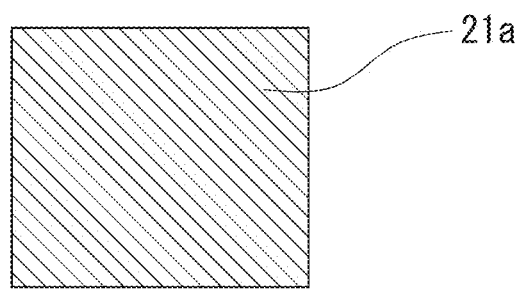
FIG. 10B is a schematic illustration of a discharge electrode of the hydrogenation apparatus shown in FIG. 10A as viewed from above.
Figure 10C:
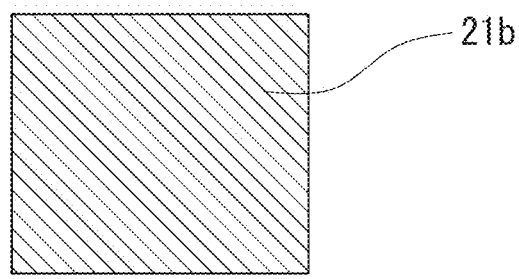
FIG. 10C is a schematic illustration of a ground electrode of the hydrogenation apparatus shown in FIG. 10A as viewed from below.

It is noted that in FIG. 7, the electrode 21b of the electrodes 21a, 21b, which is arranged below, is grounded, while the electrode 21a arranged above is connected to the power source 50. However, the present invention is not limited to this configuration. It is possible that the electrode 21b arranged below is connected to the power source 50, while the electrode 21a arranged above is ground. Further, the discharge electrode 21a and the ground electrode 21b are mounted at the dielectrics 22a, 22b, respectively, in FIG. 7, which does not limit the present invention. As shown in FIG. 8, only the discharge electrode 21a may be mounted at the dielectric 22. Alternatively, as shown in FIG. 9, only the ground electrode 21b may be mounted at the dielectric 22. Further, as shown in FIG. 10, it is possible that the two electrodes 21a, 21b are not mounted at the dielectrics 22a, 22b, but face each other with the gas containing the hydrogen gas allowed to intervene and with no dielectrics interposed therebetween.

It is noted that the electrode 21a may include a plurality of conduction parts extending in stripes. Similarly, the electrode 21b may include a plurality of conduction parts extending in stripes. When the electrodes 21a, 21b include the conduction parts in stripes, the ionized gas density can be controlled with high accuracy. Control of the ionized gas density can easily suppress an increase in temperature of the amorphous silicon film S. Further, since elimination of bonding defects of and change in configuration of the amorphous silicon film S can be achieved at a position where ionized gas is generated, plasma may be generated so that the ionized gas performs scan across the amorphous silicon film S. As such, the electrodes 21a, 21b may be formed linearly. Further, even where the electrodes 21a, 21b are linear, the dielectric(s) 22 (22a, 22b) may or may not be provided to the electrodes 21a, 21b. In addition, the electrodes 21a, 21b may be the same or different in shape. For example, one of the electrodes 21a, 21b may be in plate-like shape, while the other may be linear.

Figure 11A:
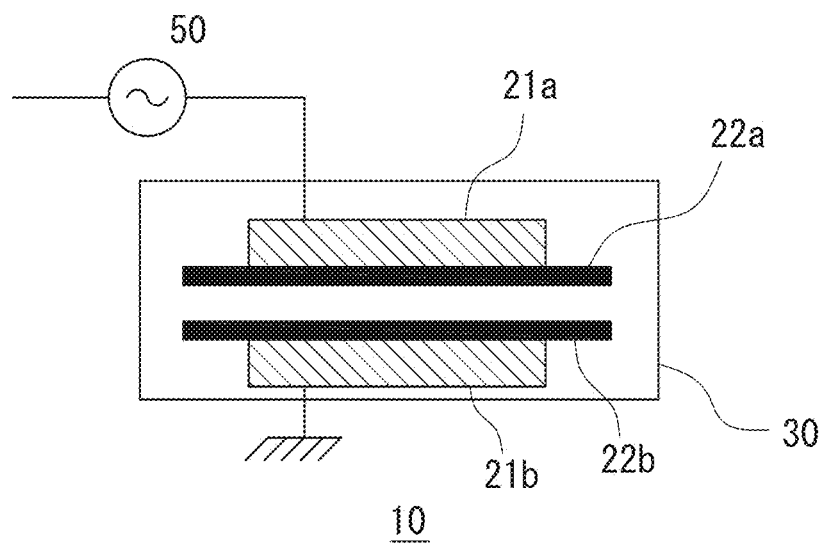
FIG. 11A is a schematic illustration showing a hydrogenation apparatus according to one embodiment.
Figure 11B:
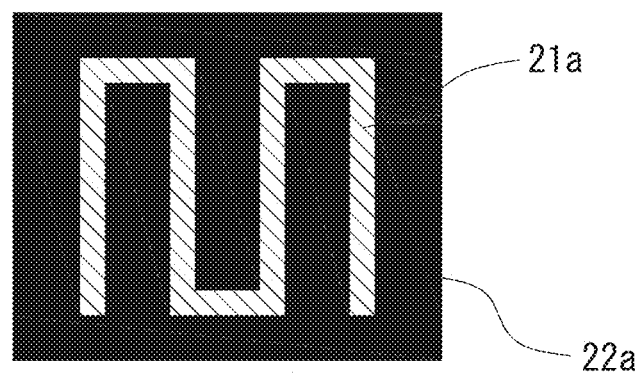
FIG. 11B is a schematic illustration of a discharge electrode of the hydrogenation apparatus shown in FIG. 11A as viewed from above.
Figure 11C:
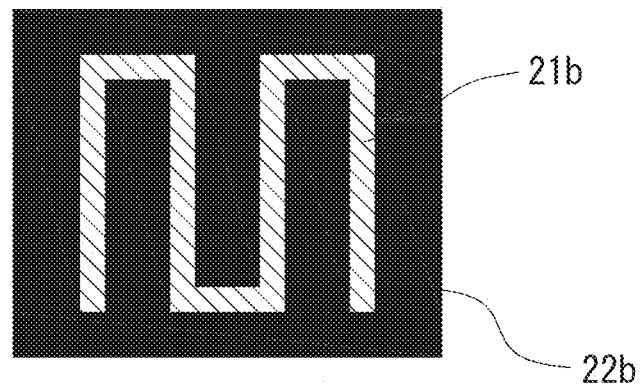
FIG. 11C is a schematic illustration of a ground electrode of the hydrogenation apparatus shown in FIG. 11A as viewed from below.

With reference to FIG. 11, a hydrogenation apparatus 10 will be described in which linear electrodes 21a, 21b are mounted at dielectrics 22a, 22b, respectively. FIG. 11A is a schematic illustration of the hydrogenation apparatus 10. FIG. 11B is a schematic illustration of the electrode 21a as viewed from above. FIG. 11C is a schematic illustration of the electrode 21b as viewed from below. In this hydrogenation apparatus 10, the dielectric 22a to which the electrode 21a is attached is arranged opposite to the dielectric 22b to which the electrode 21b is attached. The electrode 21b is also grounded herein. Each of the electrodes 21a, 21b is a linear electrode and includes at least two or more conduction parts extending in stripes. With the linear electrodes 21a, 21b, the ionized gas density can be controlled easily. The linear electrodes 21a, 21b may be formed by processing a metal plate or a metal mesh.

It is noted that the hydrogenation apparatus 10 shown in FIG. 11 has a configuration in which the electrodes 21a, 21b are mounted at the dielectrics 22a, 22b, respectively, which does not limit the present invention. Only one of the electrodes 21a, 21b may be mounted at a dielectric. For example, the electrode 21a may be mounted at a dielectric 22 with the electrode 21b not mounted at a dielectric.

Figure 12A:
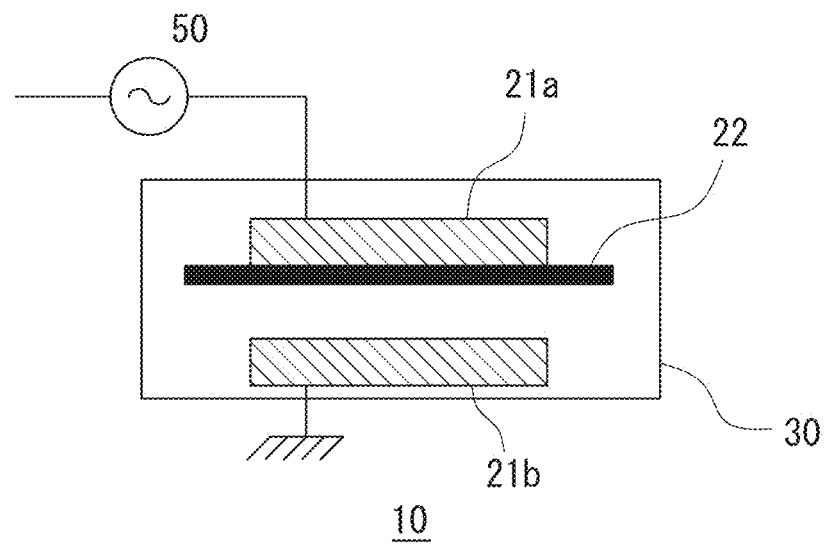
FIG. 12A is a schematic illustration showing a hydrogenation apparatus according to one embodiment.
Figure 12B:
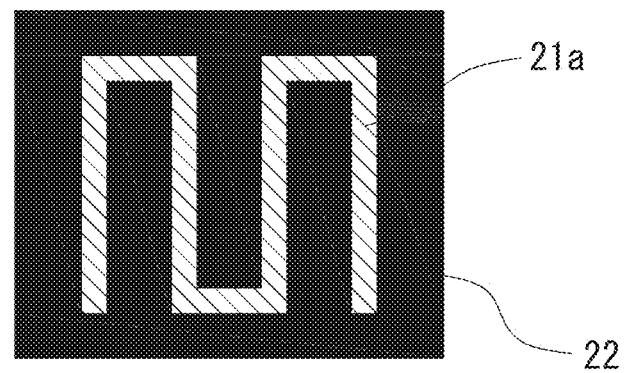
FIG. 12B is a schematic illustration of a discharge electrode of the hydrogenation apparatus shown in FIG. 12A as viewed from above.
Figure 12C:
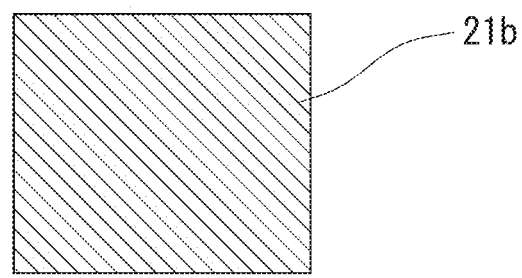
FIG. 12C is a schematic illustration of a ground electrode of the hydrogenation apparatus shown in FIG. 12A as viewed from below.

With reference to FIG. 12, a hydrogenation apparatus 10 will be described which includes an electrode 21a mounted at a dielectric 22 and an electrode 21b not mounted at a dielectric. FIG. 12A is a schematic illustration of the hydrogenation apparatus 10. FIG. 12B is a schematic illustration of the electrode 21a as viewed from above. FIG. 12C is a schematic illustration of the electrode 21b as viewed from below. The electrode 21a herein is mounted at the dielectric 22, while the electrode 21b is not mounted at a dielectric. The electrode 21b is arranged opposite to the dielectric 22 at which the electrode 21a is mounted. Further, the electrode 21a is a linear electrode, while the grounded electrode 21b has a plate-like shape.

It is noted that in the hydrogenation apparatus 10 shown in FIG. 12, the electrode 21b is not mounted at a dielectric, while the electrode 21a is mounted at the dielectric 22, which does not limit the present invention. The electrode 21b may be mounted at the dielectric 22 with the electrode 21a not mounted at a dielectric.

Figure 13A:
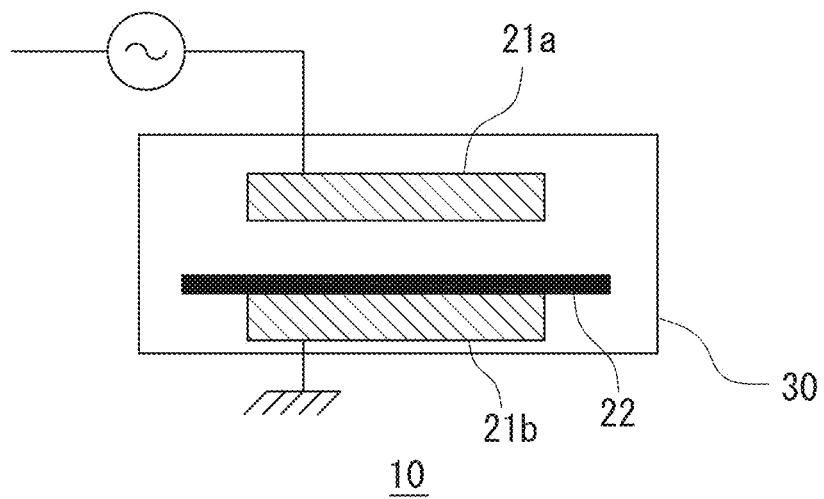
FIG. 13A is a schematic illustration showing a hydrogenation apparatus according to one embodiment.
Figure 13B:
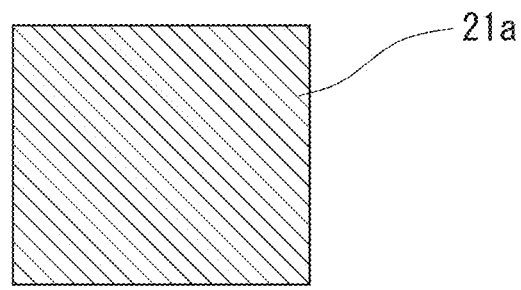
FIG. 13B is a schematic illustration of a discharge electrode of the hydrogenation apparatus shown in FIG. 13A as viewed from above.
Figure 13C:
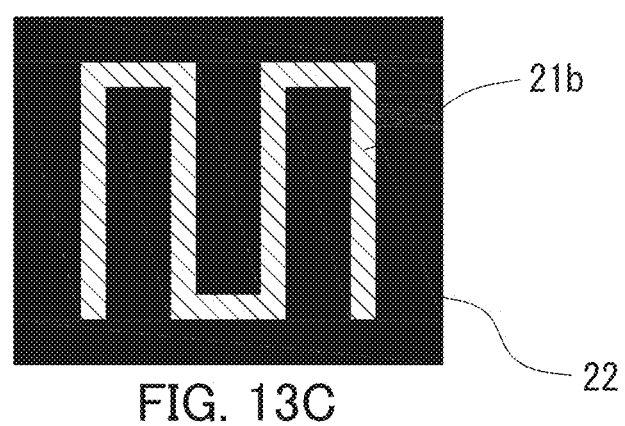
FIG. 13C is a schematic illustration of a ground electrode of the hydrogenation apparatus shown in FIG. 13A as viewed from below.

With reference to FIG. 13, a hydrogenation apparatus 10 will be described which includes an electrode 21a which is not mounted at a dielectric and an electrode 21b which is mounted at a dielectric 22. FIG. 13A is a schematic illustration of the hydrogenation apparatus 10. FIG. 13B is a schematic illustration of the electrode 21a as viewed from above. FIG. 13C is a schematic illustration of the electrode 21b as viewed from below. In the hydrogenation apparatus 10 shown in FIG. 13, the dielectric 22 at which the electrode 21b is mounted is arranged opposite to the electrode 21a. The electrode 21a has a plate-like shape, while the grounded electrode 21b is a linear electrode.

Referring to the hydrogenation apparatuses 10 shown in FIGS. 11-13, at least one of the electrodes 21a, 21b is mounted at the dielectric 22, and the electrodes 21a, 21b are arranged opposite to each other with the dielectric 22 interposed therebetween, which does not limit the present invention. The electrodes 21a, 21b may be arranged opposite to each other with intervention of the gas containing the hydrogen gas with no dielectric interposed therebetween and with neither the electrode 21a nor the electrode 21b being mounted at a dielectric.

Figure 14A:
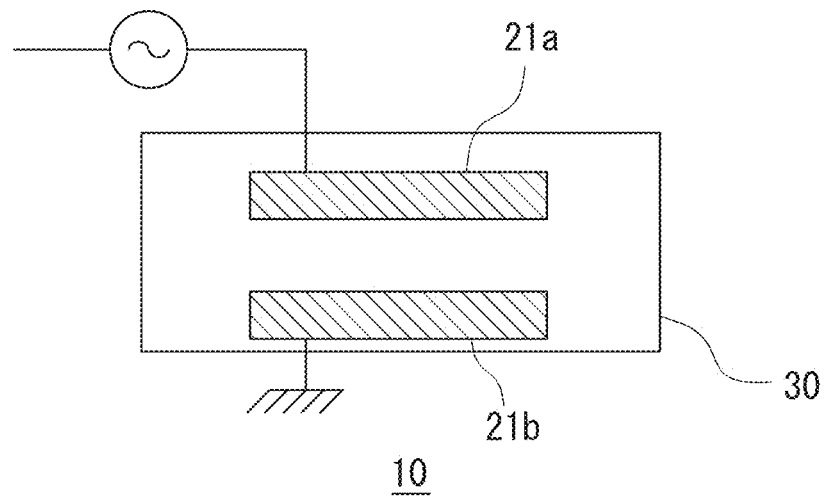
FIG. 14A is a schematic illustration showing a hydrogenation apparatus according to one embodiment.
Figure 14B:
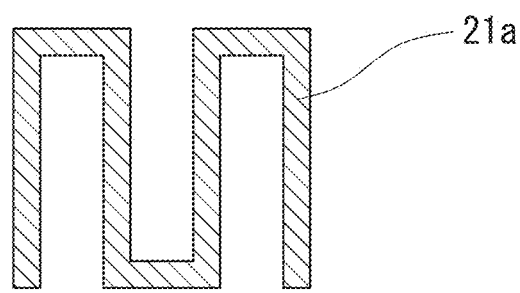
FIG. 14B is a schematic illustration of a discharge electrode of the hydrogenation apparatus shown in FIG. 14A as viewed from above.
Figure 14C:
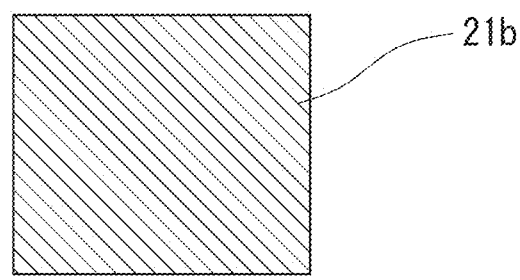
FIG. 14C is a schematic illustration of a ground electrode of the hydrogenation apparatus shown in FIG. 14A as viewed from below.

With reference to FIG. 14, a hydrogenation apparatus 10 will be described which includes electrodes 21a, 21b not mounted at a dielectric. FIG. 14A is a schematic illustration of the hydrogenation apparatus 10. FIG. 14B is a schematic illustration of the electrode 21a as viewed from above. FIG. 14C is a schematic illustration of the electrode 21b as viewed from below. In the hydrogenation apparatus 10 shown in FIG. 14, the electrode 21a is a linear electrode, while the grounded electrode 21b has a plate-like shape.

It is noted that in the hydrogenation apparatus 10 shown in FIG. 14, the electrode 21a is a linear electrode, while the electrode 21b has a plate-like shape, which does not limit the present invention. In the hydrogenation apparatus 10, the electrode 21a may have a plate-like shape, while the electrode 21b may be a linear electrode.

Figure 15A:
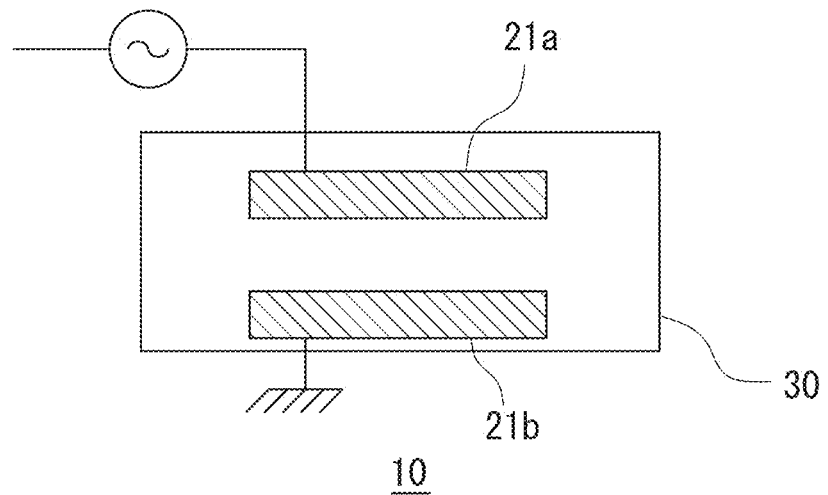
FIG. 15A is a schematic illustration showing a hydrogenation apparatus according to one embodiment.
Figure 15B:
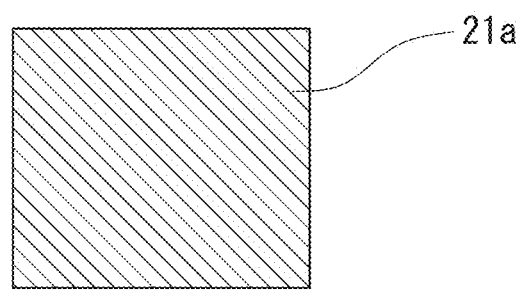
FIG. 15B is a schematic illustration of a discharge electrode of the hydrogenation apparatus shown in FIG. 15A as viewed from above.
Figure 15C:
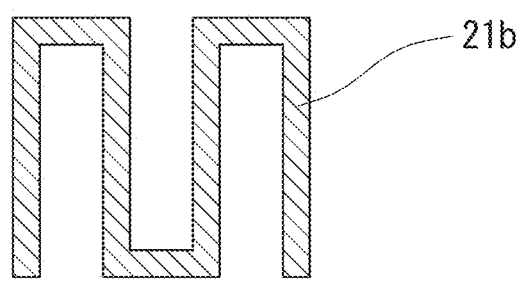
FIG. 15C is a schematic illustration of a ground electrode of the hydrogenation apparatus shown in FIG. 15A as viewed from below.

FIG. 15A is a schematic illustration of a hydrogenation apparatus 10. FIG. 15B is a schematic illustration of an electrode 21a as viewed from above. FIG. 15C is a schematic illustration of an electrode 21b as viewed from below. In the hydrogenation apparatus 10 shown in FIG. 15, the electrode 21a has a plate-like shape, while the grounded electrode 21b is a linear electrode.

It is noted that in the hydrogenation apparatuses 10 shown in FIGS. 11-15, at least one of the electrodes 21a, 21b is a linear electrode including the conductive parts which extend in parallel to each other in stripes and are connected to different conductive parts, which does not limit the present invention. The linear electrode may include branch portions extending in stripes in a direction parallel to a given direction from one trunk part to have a comb-like shape.

Further, in the hydrogenation apparatuses 10 shown in FIGS. 11-15, comparatively thin plate-shaped or linear conductive members are used as the electrodes 21a, 21b, which does not limit the present invention.

Figure 16:
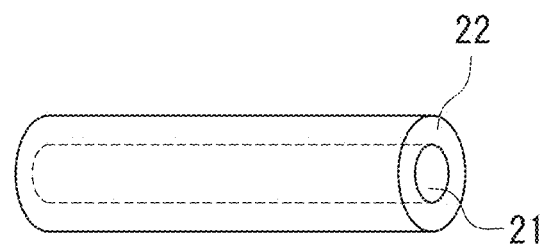
FIG. 16 is a schematic illustration of a rod-shaped electrode of a hydrogenation apparatus according to one embodiment.

FIG. 16 is a schematic illustration of one electrode 21 in a hydrogenation apparatus 10. The electrode 21 herein has a rod shape. For example, the electrode 21 is formed of a rod-shaped metal. The electrode 21 is disposed inside a tubular dielectric 22. The dielectric 22 is made of an insulating material, e.g., an organic insulator. In this case, the area for ionized gas generation can be comparatively easily controlled. For the organic insulator formed in tubular shape, polytetrafluoroethylene, polyethylene, or vinyl chloride may be used, for example. Further, examples of the rod-shaped metal include a stainless wire, a copper wire, a silver wire, a gold wire, etc. For example, a copper wire may be used as the electrode 21, and the copper wire may be covered with polytetrafluoroethylene.

The discharge electrode 21a may be formed as the thus covered electrode 21, while the ground electrode 21b of a metal mesh or a metal plate may be mounted at the dielectric 22b. In this case, the amorphous silicon film S is arranged preferably 0.5 mm or more apart from the electrode 21a. Alternatively, the ground electrode 21b may be formed as the thus covered electrode 21, and the discharge electrode 21a of a metal mesh or a metal plate may be mounted at the dielectric 22a.

Alternatively, the discharge electrode 21a may be formed as the thus covered electrode 21, and the ground electrode 21b may be formed of a metal mesh or a metal plate. Or, the ground electrode 21b may be formed as the thus covered electrode 21, and the discharge electrode 21a may be formed of a metal mesh or a metal plate.

According to the present embodiment, the gas containing the hydrogen gas generates plasma at a pressure around the atmospheric pressure in the chamber 30. The hydrogen ions ionized by the plasma can terminate the dangling bonds of the amorphous silicon film S to eliminate bonding defects. Further, by the hydrogenation, the configuration of the amorphous silicon film S can be controlled in addition to elimination of bonding defects. Thus, the amorphous silicon film S can be formed in which an amorphous state and crystalline state are mixed.

It is noted that in the hydrogenation apparatus 10, the region where the ionized gas is generated is defined by the area of the electrodes 21a, 21b. Accordingly, changing the electrodes 21a, 21b can result in control of the region where the hydrogenation is performed. For example, where the amorphous silicon film is formed on an insulating layer, heat may be stored in the insulating layer to degrade its insulating property. However, appropriate change of the electrodes 21a, 21b can suppress such thermal damage.

It is noted that plasma is generated between the electrodes 21a, 21b, and the amorphous silicon film S is disposed between the electrodes 21a, 21b in the above description, which does not limit the present invention.

Figure 17A:
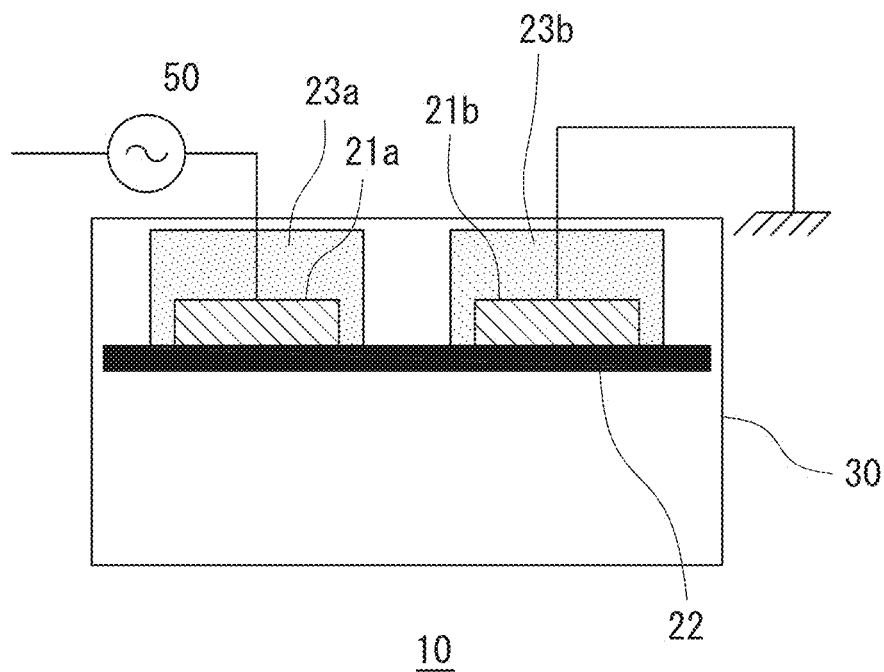
FIG. 17A is a schematic side view of a hydrogenation apparatus according to one embodiment.
Figure 17B:
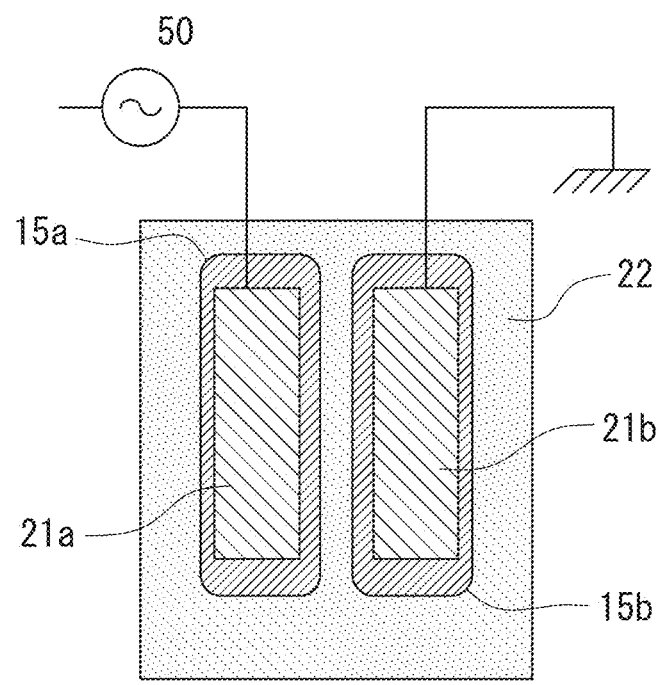
FIG. 17B is a schematic tope view according to FIG. 17A.

FIG. 17A is a schematic side view of a hydrogenation apparatus 10 according to one embodiment. FIG. 17B is a schematic tope view thereof. As shown, electrodes 21a, 21b may be arranged on one of the principal surfaces of a dielectric 22, and plasma may be generated in the vicinity of the other principal surface of the dielectric 22. Such discharge may be called surface discharge. For example, the electrodes 21a, 21b are disposed on one of the principal surfaces of the dielectrics 22 with a predetermined space left. Each of the electrodes 21a, 21b is a metal plate or a metal mesh. Here, the electrode 21a is covered with an insulating material 23a, while the electrode 21b is covered with an insulating material 23b. Accordingly, direct discharge can be prevented from occurring between the electrode 21a and the electrode 21b. It is noted that organic resin may be used for the insulating materials 23a, 23b, for example. Specifically, epoxy resin may be used for the organic resin.

The distance between the electrode 21a and the electrode 21b is adjusted according to the applied voltage. For example, the distance between the electrode 21a and the electrode 21b is about 2 cm. Voltage application to the above electrodes 21a, 21b can ionize the gas in the vicinity of the principal surface different from the principal surface of the dielectric 22 at which the electrode 21a, 21b are mounted.

The hydrogenation is performed by allowing the amorphous silicon film S to pass in the region where the ionized hydrogen gas is formed by surface discharge. For example, a substrate on which the amorphous silicon film S is provided may be scanned relative to the electrodes 21a, 21b that are fixed. Alternatively, the electrodes 21a, 21b may be scanned relative to a fixed substrate on which the amorphous silicon film S is provided.

In the case using a large substrate, for example, the hydrogenation apparatus 10 can perform the hydrogenation by scanning the ionized gas generation section 21x (see FIG. 4) relative to the substrate. Alternatively, hydrogenation can be performed by scanning the substrate with the ionized gas generation section 21x fixed.

It is noted that when the amorphous silicon film S is disposed between the electrode 21a and the electrode 21b, abnormal discharge may occur. For example, in the case where the amorphous silicon film S is formed on an insulating layer (typically, an insulating layer made of silicon oxide or silicon nitride) with a thickness of about 100 nm on a silicon wafer, the insulating layer may be broken down upon occurrence of abnormal discharge.

Accordingly, plasma may be generated between the electrodes 21a, 21b by applying voltage between the electrode 21a and the electrode 21b in the state where the gas inside the chamber 30 is allowed to flow so as to pass between the electrode 21a and the electrode 21b and reach the amorphous silicon film S. In this case, since the amorphous silicon film S is not disposed in the electric field, damage to the amorphous silicon film S caused due to abnormal discharge can be suppressed.

Figure 18:
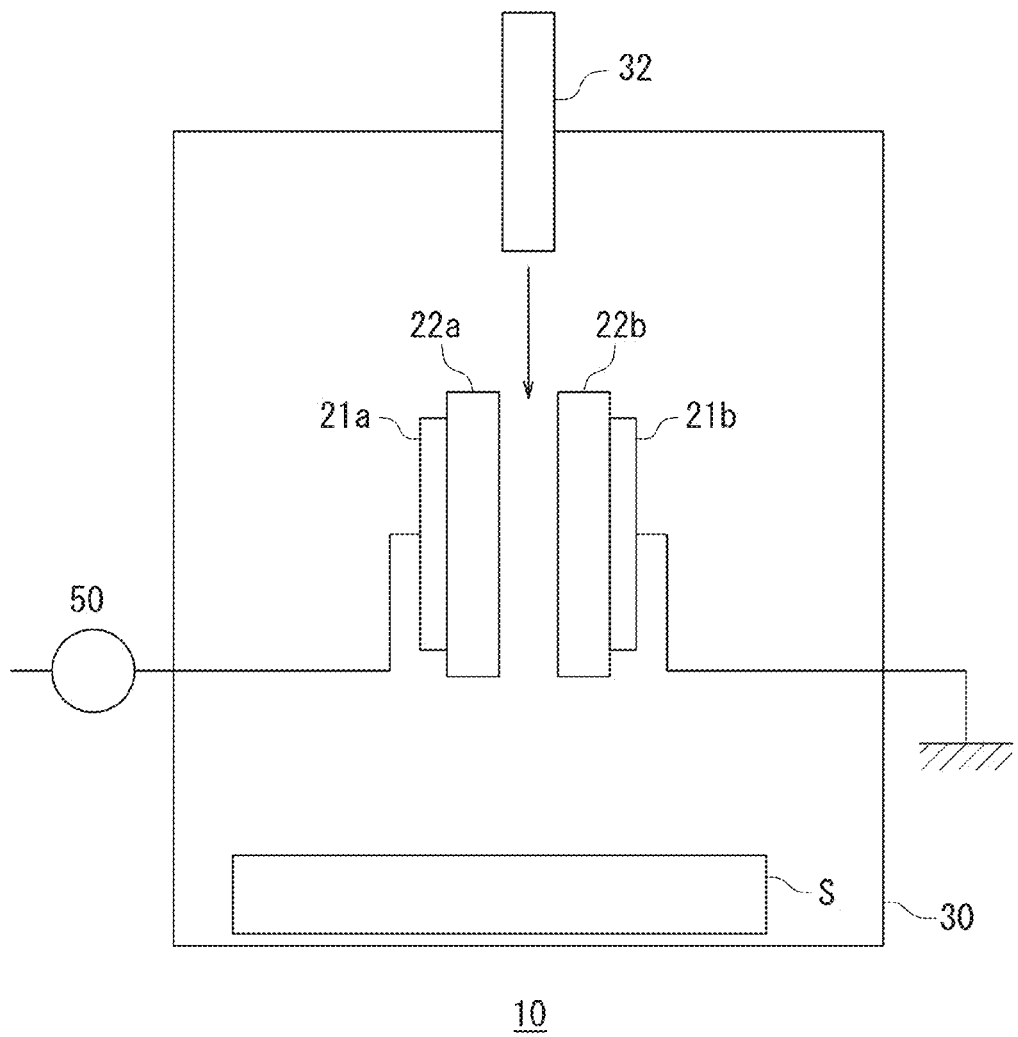
FIG. 18 is a schematic illustration of a hydrogenation apparatus according to one embodiment

FIG. 18 is a schematic illustration of a hydrogenation apparatus 10. The hydrogenation apparatus 10 shown in FIG. 18 is configured such that the amorphous silicon film S is disposed at a position other than the position between the electrode 21a and the electrode 21b, and the gas containing the hydrogen gas flows from the gas supply pipe 32 through between the electrode 21a and the electrode 21b and then reaches the amorphous silicon film S.

The electrode 21a is connected to the power source 50, while the electrode 21b is grounded. When the gas containing the hydrogen gas passes through between the electrode 21a and the electrode 21b, while the electric current is supplied to the electrode 21a to apply voltage between the electrode 21a and the electrode 21b, the hydrogen gas is ionized, thereby generating plasma. The ionized hydrogen gas reaches the amorphous silicon film S to cause hydrogenation. The plasma generated in this manner may be called remote plasma.

Figure 19:
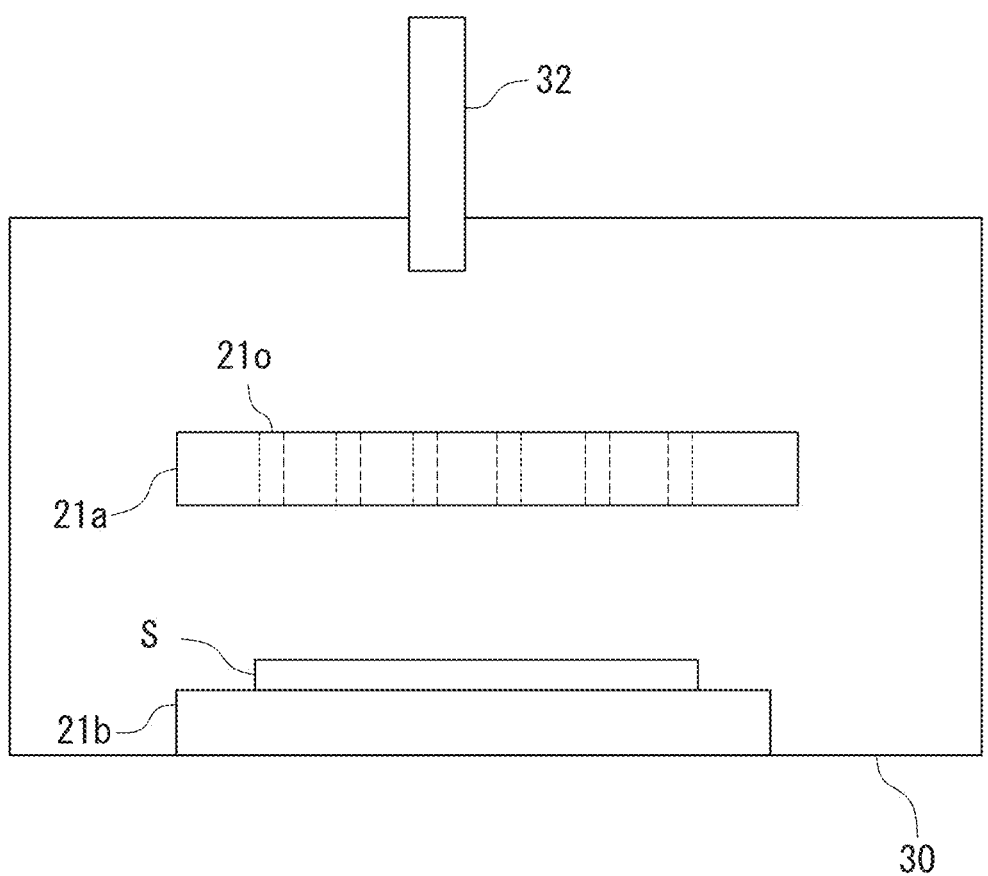
FIG. 19 is a schematic illustration of a hydrogenation apparatus according to one embodiment.

It is noted that a through hole may be formed in at least one of the electrodes 21a, 21b. FIG. 19 is a schematic illustration of a hydrogenation apparatus 10. In the hydrogenation apparatus 10 shown in FIG. 19, through holes 210 are formed in an electrode 21a. This hydrogenation apparatus 10 is configured such that the gas containing the hydrogen gas passes from the upper side of the electrode 21a through the through holes 210 of the electrode 21a and then reaches between the electrode 21a and an electrode 21b.

It is noted that plasma is generated using the gas inside the chamber 30 in the above description, which does not limit the present invention. The plasma may be generated using the gas introduced into the chamber 30.

Figure 20:
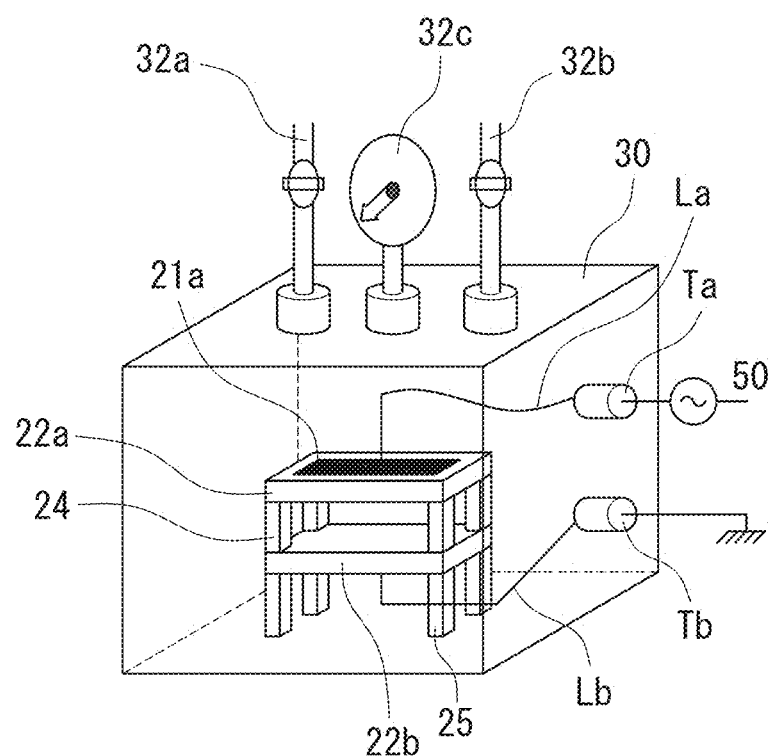
FIG. 20 is a schematic illustration of a hydrogenation apparatus according to one embodiment.
Figure 21:
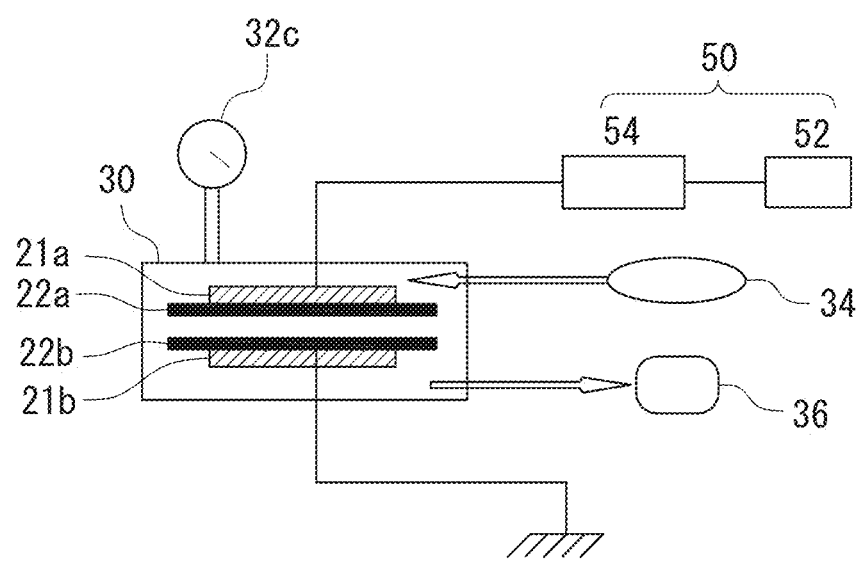
FIG. 21 is another schematic illustration of the hydrogenation apparatus shown in FIG. 20.

FIGS. 20 and 21 are schematic illustrations of a hydrogenation apparatus 10 according to one embodiment. As shown in FIG. 20, the hydrogenation apparatus 10 is of single chamber type. The hydrogenation apparatus 10 includes electrodes 21*a*, 21*b*, dielectrics 22*a*, 22*b*, and a spacer 24. In FIG. 20, the electrode 21*b*, which cannot be seen because it is covered with the dielectric 22*b*, is connected to a ground terminal Tb through a ground wire Lb. On the other hand, the electrode 21*a* is arranged above the electrode 21*b*. The electrode 21*a* is connected to a power source terminal Ta through a high voltage wire La.

For example, a metal mesh is used as each electrode 21*a*, 21*b*, while alumina plate is used as each dielectric 22*a*, 22*b*. It is noted that in order to prevent abnormal discharge, each entire surface of the end parts of the electrodes 21*a*, 21*b* may be covered with a tape. A polyimide tape may be used as the tape.

The dielectric 22*a* and the dielectric 22*b* in this hydrogenation apparatus 10 are arranged with the spacer 24 interposed therebetween. The spacer 24 has a length that can set the distance between the dielectric 22*a* and the amorphous silicon film S (not shown in FIGS. 20 and 21) disposed on the dielectric 22*b* to be 0.5 mm or larger. It is noted that a spacer 25 is provided between the bottom surface of the chamber 30 and the electrode 21*b* so that the electrode 21*b* is spaced a predetermined distance apart from the bottom surface of the chamber 30.

The chamber 30 includes a suction port 32*a* used for sucking out the gas inside the chamber 30 and a supply port 32*b* used for introducing the gas into the chamber 30. Though not shown in FIG. 20, the suction port 32*a* may be connected to a vacuum pump, and the supply port 32*b* may be connected to a gas canister filled with the mixed gas. Further, a pressure gauge 32*c* indicative of the pressure inside the chamber 30 is mounted at the chamber 30.

FIG. 21 is another schematic illustration of the hydrogenation apparatus 10 shown in FIG. 20. For the sake of simplicity of the discussion, the spacers 24, 25 are omitted herein. The electrodes 21*a*, 21*b* are attached to almost the centers of the principal surfaces of the dielectrics 22*a*, 22*b*, respectively. The electrode 21*a* is arranged above, while the electrode 21*b* is arranged below. The electrodes 21*a*, 21*b* are arranged so as to face outward of the dielectrics 22*a*, 22*b*, respectively. The mixed gas is introduced into the chamber 30 through a gas canister 34. Further, the air inside the chamber 30 is removed using a vacuum pump 36.

The power source 50 includes a waveform controller 52 and a voltage amplifier 54. The waveform controller 52 outputs a signal indicative of voltage with a controlled waveform. The voltage amplifier 54 generates an output signal obtained by amplifying the voltage of the signal from the waveform controller 52. For example, the waveform controller 52 outputs a signal having a voltage of 100 volts. The voltage amplifier 54 amplifies the voltage of the waveform controller 52 by 1000 times to generate a signal having a voltage of 10 kilovolts and a frequency of 10 kilohertz. The electrode 21*a* is connected to the voltage amplifier 54. The electrode 21*b* is connected to the ground.

For example, the chamber 30 inside which the electrodes 21*a*, 21*b* and the amorphous silicon film S (not shown herein) are disposed is sealed, and the air inside the chamber 30 is removed (degassed) using the vacuum pump 36. Then, a mixed gas is introduced into the chamber 30 from the gas canister 34. Here, the mixed gas contains helium and hydrogen. Degassing and mixed gas introduction may be repeated plural times. It is noted that mixed gas introduction as above can prevent contamination in the chamber 30 with an impurity and can control the condition inside of the chamber 30 at plasma generation.

After a predetermined gas is filled with the chamber 30, alternating current at high voltage and high frequency is supplied between the electrode 21*a* and the electrode 21*b* to ionize at least part of the mixed gas, thereby generating plasma. With the amorphous silicon film S disposed inside the chamber 30, hydrogenation of the amorphous silicon film S is performed by the ionized hydrogen gas. Thus, bonding defects of the amorphous silicon film S can be eliminated.

It is noted that the temperature of the amorphous silicon film S at plasma generation can be adjusted according to the structure of the electrodes, the mixed gas, and the voltage between the electrodes 21*a*, 21*b*. For example, the amorphous silicon film S may be damaged by heat at plasma generation. However, changing the structure of the electrodes can change the ionized gas density, thereby controlling damage to the amorphous silicon film S caused by the heat.

As described above, the hydrogenation apparatus 10 according to the present embodiment can eliminate bonding defects by generating plasma. It is noted that such defects may be induced when a polycrystalline semiconductor film is formed by laser irradiation and when an impurity element is implanted to a semiconductor film. However, the hydrogenation apparatus 10 according to the present embodiment can be suitably used also for elimination of defects (lattice defects) induced in this way.

It is noted that the plasma generation section 20 allows plasma to be generated by the electric filed formed between the two electrodes in the above description, which does not limit the present invention. The plasma generation section 20 may allow plasma to be generated by an electromagnetic field.

Figure 22:
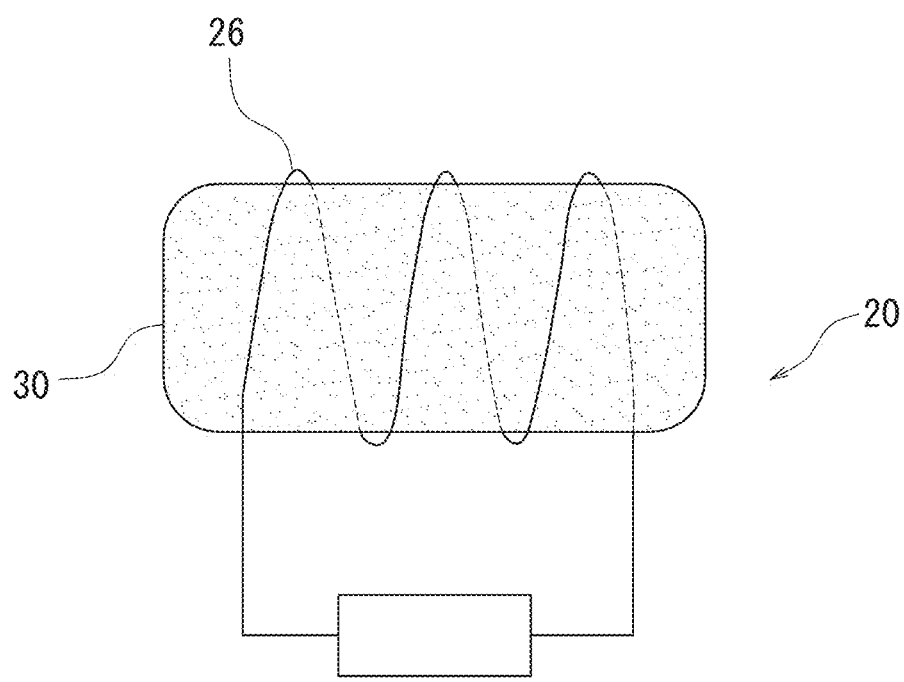
FIG. 22 is a schematic illustration of a hydrogenation apparatus according to one embodiment.

FIG. 22 is a schematic illustration of a hydrogenation apparatus 10 according to one embodiment. A plasma generation section 20 in this hydrogenation apparatus 10 includes a coil 26. Here, the gas containing the hydrogen gas passes inside the hermetic member 30, and the coil 26 is arranged so as to surround the hermetic member 30. Application of predetermined alternating voltage to the coil 26 generates plasma inside the hermetic member 30. The generated plasma reaches the amorphous silicon film S (not shown herein) to initiate plasma treatment. It is noted that the coil 26 is arranged so as to surround the hermetic member 30 in FIG. 22, which does not limit the present invention. The coil 26 may be arranged outside the end part of the hermetic member 30.

Figure 23:
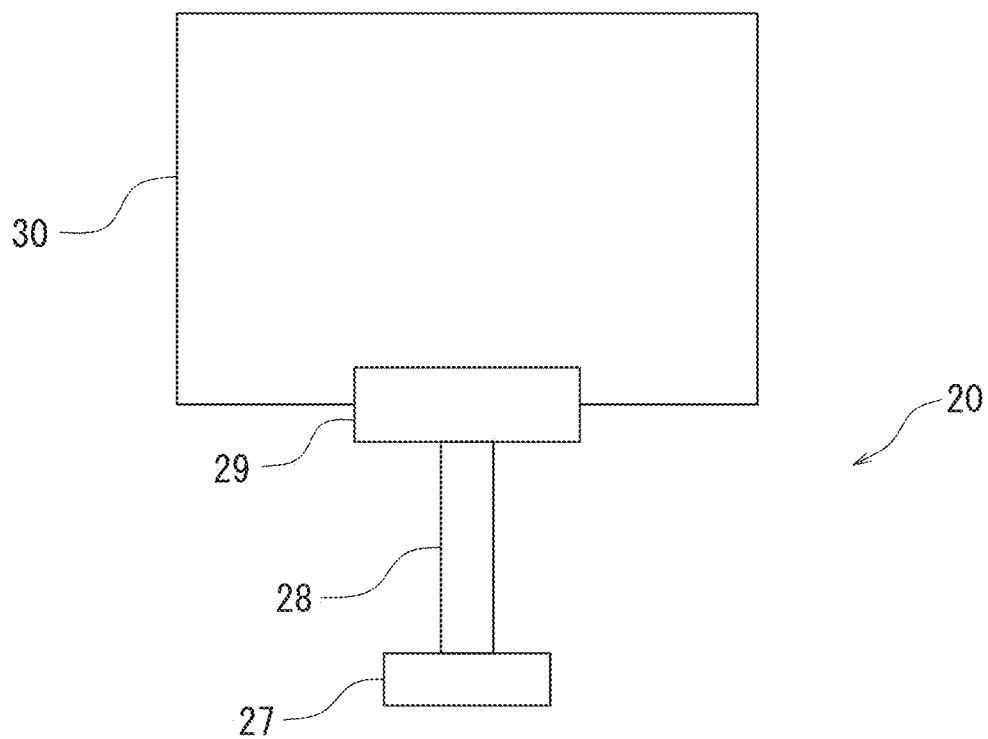
FIG. 23 is a schematic illustration of a hydrogenation apparatus according to one embodiment.

FIG. 23 is a schematic illustration of a hydrogenation apparatus 10 according to one embodiment. In the hydrogenation apparatus 10, a plasma generation section 20 includes a microwave generating device 27, a waveguide 28, and antenna (coil) 29. Microwaves generated in the microwave generating device 27 are transmitted into the hermetic member 30 via the waveguide 28 and the antenna 29. Transmission of the microwaves generates plasma inside the hermetic member 30. The generated plasma reaches the amorphous silicon film S (not shown herein), thereby initiating plasma treatment.

EXAMPLES

Specific examples will be described below. However, the following examples do not limit the present invention.

Example 1

Here, the aforementioned hydrogenation apparatus 10 with reference to FIGS. 20 and 21 was used. Square metal meshes with a length of about 60 mm were used as the electrodes 21a, 21b. Alumina plates with a thickness of about 5 mm were used as the dielectrics 22a, 22b. The metal meshes 21a, 21b were attached to almost the centers of the principal surfaces of the alumina plates 22a, 22b, respectively. Each end surface of the metal meshes 21a, 21b was sealed with a polyimide tape. The metal mesh 21a was arranged above, while the metal mesh 21b was arranged below. The metal meshes 21a, 21b were arranged so as to face outward of the alumina plates 22a, 22b, respectively. A Bakelite plate with a thickness of 9.6 mm was used as the spacer 24. The metal meshes 21a, 21b and the alumina plates 22a, 22b as above were set inside the chamber 30. The electrode 21a was connected to the high voltage power source 50 through the wire La for high voltage. The electrode 21b was connected to a ground wire.

After the pressure inside the chamber 30 was reduced up to $5.5 \times 10^{-1}$ Pascals by using the vacuum pump 36, the air was replaced by a helium gas at a purity of 99.9999%. After the pressure reduction and the helium gas replacement were repeated twice, the pressure inside the chamber 30 was reduced again to $5.5 \times 10^{-1}$ Pascals by using the vacuum pump 36.

Thereafter, a mixed gas was introduced into the chamber 30. The mixed gas was a gas obtained by mixing a helium gas and a hydrogen gas at a ratio of 96:4. The mixed gas was filled until the pressure of the mixed gas became around the atmospheric pressure.

Then, voltage was applied between the metal meshes 21a, 21b inside the chamber 30 to generate plasma. The waveform controller 52 output a signal having a predetermined voltage, and the voltage amplifier 54 amplifies the voltage of the waveform controller 52 by 1000 times to generate an output signal.

Specifically, the output voltage of the waveform controller 52 was 1.8 V, 3.5 V, 4.0 V, 4.5 V, and 5.5 V. The voltage applied to the metal meshes 21a was 1.8 kV, 3.5 kV, 4.0 kV, 4.5 kV, and 5.5 kV. It is noted that each voltage waveform was a sine wave, and the frequency of the voltages was 10 kHz. The discharge states under the five conditions different in voltage applied to the metal mesh 21a were observed.

Table 1 indicates details of the five different conditions (hereinafter referred to as Conditions 1-5) of the voltages applied to the metal mesh 21a and the discharge states thereunder. Under these conditions, streamer discharge was formed between the electrodes 21a, 21b. Further, it was recognized that the higher the voltage was raised, the more widely the streamer discharge extended between the electrodes 21a, 21b. It is noted that glow discharge was not formed at the comparatively high output frequency, 10 kHz.

TABLE 1

| Condition | Pressure inside chamber | Input waveform | Output voltage of waveform controller (V) | Output frequency (kHz) | Discharge state |
|---|---|---|---|---|---|
| Condition 1 | Atmospheric pressure | Sine wave | 1.8 | 10 | Streamer |
| Condition 2 | Atmospheric pressure | Sine wave | 3.5 | 10 | Streamer |
| Condition 3 | Atmospheric pressure | Sine wave | 4.0 | 10 | Streamer |
| Condition 4 | Atmospheric pressure | Sine wave | 4.5 | 10 | Streamer |

TABLE 1-continued

| Condition | Pressure inside chamber | Input waveform | Output voltage of waveform controller (V) | Output frequency (kHz) | Discharge state |
|---|---|---|---|---|---|
| Condition 5 | Atmospheric pressure | Sine wave | 5.5 | 10 | Streamer |

Example 2

Except that the voltage applied to the metal mesh 21a was changed, the plasma was generated in the manner similar to that in EXAMPLE 1. Specifically, the output voltage of the waveform controller 52 was 1.8 V, 3.5 V, 3.8 V, 4.3 V, 7.0 V, and 8.0 V. The voltage applied to the metal mesh 21a was 1.8 kV, 3.5 kV, 3.8 kV, 4.3 kV, 7.0 kV, and 8.0 kV. It is noted that in each case, the voltage waveform was a sine wave, and the frequency of the voltages was 1 kHz. The discharge states under the six conditions different in voltage applied to the metal mesh 21a were observed.

Table 2 indicates details of the six different conditions (hereinafter referred to as Conditions 6-11) of the voltages applied to the metal mesh 21a and the discharge states thereunder. It was recognized that when the frequency of the voltage was comparatively low, 1 kHz, application of voltage over 3.5 kV to the metal mesh 21a caused glow discharge.

TABLE 2

| Condition | Pressure inside chamber | Input waveform | Output voltage of waveform controller (V) | Output frequency (kHz) | Discharge state |
|---|---|---|---|---|---|
| Condition 6 | Atmospheric pressure | Sine wave | 1.8 | 1 | Streamer |
| Condition 7 | Atmospheric pressure | Sine wave | 3.5 | 1 | Grow |
| Condition 8 | Atmospheric pressure | Sine wave | 3.8 | 1 | Grow |
| Condition 9 | Atmospheric pressure | Sine wave | 4.3 | 1 | Grow |
| Condition 10 | Atmospheric pressure | Sine wave | 7.0 | 1 | Grow |
| Condition 11 | Atmospheric pressure | Sine wave | 8.0 | 1 | Grow |

Example 3

Except that the voltage applied to the metal mesh 21a was changed, the plasma was generated in the manner similar to that in EXAMPLE 1 or 2. Specifically, the output voltage of the waveform controller 52 was 1.8 V, 3.5 V, 3.9 V, 4.3 V, and 7.0 V. The voltage applied to the metal mesh 21a was 1.8 kV, 3.5 kV, 3.9 kV, 4.3 kV, and 7.0 kV. It is noted that in each case, the voltage waveform was a sine wave, and the frequency of the voltages was 0.5 kHz. The discharge states under the five conditions different in voltage applied to the metal mesh 21a were observed.

Table 3 indicates details of the five different conditions (hereinafter referred to as Conditions 12-16) of the voltages applied to the metal mesh 21a and the discharge states thereunder. It was recognized that when the frequency of the voltage was comparatively low, 0.5 kHz, application of voltage over 3.5 kV to the metal mesh 21a caused glow discharge.

TABLE 3

| Condition | Pressure inside chamber | Input waveform | Output voltage of waveform controller (V) | Output frequency (kHz) | Discharge state |
|---|---|---|---|---|---|
| Condition 12 | Atmospheric pressure | Sine wave | 1.8 | 0.5 | Streamer |
| Condition 13 | Atmospheric pressure | Sine wave | 3.5 | 0.5 | Glow |
| Condition 14 | Atmospheric pressure | Sine wave | 3.9 | 0.5 | Glow |
| Condition 15 | Atmospheric pressure | Sine wave | 4.3 | 0.5 | Glow |
| Condition 16 | Atmospheric pressure | Sine wave | 7.0 | 0.5 | Glow |

Example 4

Except that the distance between the alumina plates 22a, 22b and the voltage applied to the metal mesh 21a ware changed, the plasma was generated in the manner similar to that in EXAMPLES 1-3. Specifically, the distance between the alumina plates 22a, 22b was 6.4 mm. The output voltage of the waveform controller 52 was 3.5 V, 4.2 V, and 5.3 V. The voltage applied to the metal mesh 21a was 3.5 kV, 4.2 kV, and 5.3 kV. It is noted that in each case, the voltage waveform was a sine wave, and the frequency of the voltages was 10 kHz. The discharge states under the three conditions different in voltage applied to the metal mesh 21a were observed.

Table 4 indicates details of the three different conditions (hereinafter referred to as Conditions 17-19) of the voltages applied to the metal mesh 21a and the discharge states thereunder. It was recognized that even when the frequency of the voltage was comparatively high, 10 kHz, application of voltage over 4.2 kV to the metal mesh 21a caused glow discharge because of the short distance between the alumina plates 22a, 22b, and in turn, between the metal meshes 21a, 21b.

TABLE 4

| Condition | Pressure inside chamber | Input waveform | Output voltage of waveform controller (V) | Output frequency (kHz) | Discharge state |
|---|---|---|---|---|---|
| Condition 17 | Atmospheric pressure | Sine wave | 3.5 | 10 | Streamer |
| Condition 18 | Atmospheric pressure | Sine wave | 4.2 | 10 | Glow |
| Condition 19 | Atmospheric pressure | Sine wave | 5.3 | 10 | Glow |

Example 5

Except that the voltage applied to the metal mesh 21a was changed, the plasma was generated in the manner similar to that in EXAMPLE 4. The output voltage of the waveform controller 52 was 2.9 V, 5.2 V, 7.5 V, and 9.0 V. The voltage applied to the metal mesh 21a was 2.9 kV, 5.2 kV, and 7.5 kV, and 9.0 kV. It is noted that in each case, the voltage waveform was a sine wave, and the frequency of the voltages was 1 kHz. The discharge states under the four conditions different in voltage applied to the metal mesh 21a were observed.

Table 5 indicates details of the four different conditions (hereinafter referred to as Conditions 20-23) of the voltages applied to the metal mesh 21a and the discharge states thereunder. It was recognized that even when the frequency of the voltage was comparatively high, 1 kHz, application of voltage of even about 1.8 kV to the metal mesh 21a could cause glow discharge because of the short distance between the alumina plates 22a, 22b, and in turn, between the metal meshes 21a, 21b.

TABLE 5

| Condition | Pressure inside chamber | Input waveform | Output voltage of waveform controller (V) | Output frequency (kHz) | Discharge state |
|---|---|---|---|---|---|
| Condition 20 | Atmospheric pressure | Sine wave | 2.9 | 1 | Glow |
| Condition 21 | Atmospheric pressure | Sine wave | 5.2 | 1 | Glow |
| Condition 22 | Atmospheric pressure | Sine wave | 7.5 | 1 | Glow |
| Condition 23 | Atmospheric pressure | Sine wave | 9.0 | 1 | Glow |

Example 6

Except that the voltage applied to the metal mesh 21a was changed, the plasma was generated in the manner similar to that in EXAMPLES 4 or 5. The output voltage of the waveform controller 52 was 3.0 V, 5.0 V, 8.0 V, and 9.0 V. The voltage applied to the metal mesh 21a was 3.0 kV, 5.0 kV, and 8.0 kV, and 9.0 kV. It is noted that in each case, the voltage waveform was a sine wave, and the frequency of the voltages was 0.5 kHz. The discharge states under the four conditions different in voltage applied to the metal mesh 21a were observed.

Table 6 indicates details of the four different conditions (hereinafter referred to as Conditions 24-27) of the voltages applied to the metal mesh 21a and the discharge states thereunder. It was recognized that glow discharge was caused under each condition.

TABLE 6

| Condition | Pressure inside chamber | Input waveform | Output voltage of waveform controller (V) | Output frequency (kHz) | Discharge state |
|---|---|---|---|---|---|
| Condition 24 | Atmospheric pressure | Sine wave | 3.0 | 0.5 | Glow |
| Condition 25 | Atmospheric pressure | Sine wave | 5.0 | 0.5 | Glow |
| Condition 26 | Atmospheric pressure | Sine wave | 8.0 | 0.5 | Glow |
| Condition 27 | Atmospheric pressure | Sine wave | 9.0 | 0.5 | Glow |

Explanation about the amorphous silicon film will be made below. Here, the amorphous silicon film was formed using a solution of a silane compound. The method of synthesizing the amorphous silicon film is disclosed in, for example, U.S. Pat. No. 7,485,691B1. After a catalyst $Cp_2ZrPh_2$ was synthesized, poly(phenylsilane) was synthesized to finally obtain poly(hydrosilane).

Synthesis Example 1

Synthesis of Catalyst Cp$_2$ZrPh$_2$

Under a nitrogen atmosphere, dimethyl ether (DME) of 39 mL was poured into a reaction flask with a Cp$_2$ZrCl$_2$ (5.0 g) as a solvent, while the temperature was set between 0 and 10° C. At the same temperature as that of the reaction flask, a THF solution (34.37 mL) containing PhMgBr at a concentration of 37.1 moL/L was dripped, and then was stirred at a temperature of 24-26° C. for 19 hours. After concentration under reduced pressure at 20° C./20 Torr, Et$_2$O (8 mL) was added and stirred at a temperature of 24-26° C. for one hour. Further, toluene (39 mL) was added and stirred at the same temperature for 30 minutes. Then, the reaction solution was filtered. Solids obtained by concentration under reduced pressure of the filtrate at 20° C./10 Torr was washed with Et$_2$O (60 mL) and was then dried under reduced pressure at 20° C./5 Torr, thereby obtaining the target catalyst, Cp$_2$ZrPh$_2$ (5.53 g).

Synthesis Example 2

Synthesis of Poly(Phenylsilane)

Under a nitrogen atmosphere, Cp$_2$ZrPh$_2$ (0.165 g) was poured into a reaction flask. Then, PhSiH$_3$ (10 g) was added at a temperature of 24-26° C. and was stirred at the same temperature for 89 hours. Subsequently, after further addition of toluene (47 g), 3% HCl was added (68 g×5 times), and stirring, washing, and separation were performed. Thereafter, ion-exchange water (68 g) was added, and stiffing and washing were performed. After an organic layer was purified by florisil (27 g) column chromatography using toluene (118 g) as an eluent and was concentrated, the concentrate was dried at a temperature of 80° C. for two hours, thereby obtaining the target poly(phenylsilane) (8.87 g).

Synthesis Example 3

Synthesis of Poly(Hydrosilane)

Cyclohexane (43.5 g) was poured into a 100 mL brown reaction flask with poly(phenylsilane) (5.0 g) as a solvent. To this solution, AlCl$_3$ (0.41 g) was added and the mixture was solidified by liquid nitrogen. The solidified mixture was increased in temperature up to the room temperature in a water bath, and was replaced by nitrogen. To the mixture, an HCl gas was blown at a flow rate of 950 mL/min for ten hours. Then, pressure reduction and pressure recovery with nitrogen were repeated ten times to remove HCl. Under a nitrogen atmosphere, an Et$_2$O (13.72 g) solution containing LAH (1.17 g) was dripped onto the mixture over 30 minutes at a temperature of 0-10° C. After stirring at the room temperature for 12 hours, the reaction solution was poured into ion-exchange water (11 g), was stiffed for one minute, and was left. Then, the supernatant liquor was subjected to decantation. After this water washing was repeated three times, an organic layer was subjected to filtration with a membrane filter, concentration, and drying under reduced pressure, thereby obtaining the target poly(hydrosilane) (0.94 g).

Example 7

Hydrosilane obtained by the aforementioned method was dissolved into a cyclopentadiene solution and was prepared to have a concentration of 10 wt %. Then, the solution of 2.5 mL was put into a quartz vessel. Thereafter, light which shows a strong peak at a wavelength of around 300 nm was irradiated to the solution for five seconds with a high-pressure mercury-vapor lamp (4000 mW/cm$^2$) while stiffing the solution, thereby causing cross-linking of polysilane. After the cross-linking, the cross-linked polysilane was spin coated onto a quartz substrate, was held at a temperature of 450° C. for one hour in a nitrogen atmosphere, thereby forming an amorphous silicon film S. In that time, hydrogen in the amorphous silicon film S was removed to produce bonding defects.

Next, the substrate on which the amorphous silicon film S was formed was placed onto a hotplate for thermal treatment to perform temporary baking on the amorphous silicon film S. Then, the amorphous silicon film S was placed on the ground electrode 21b.

After the chamber 30 was sealed, and the gas inside the chamber 30 was removed (degassed) using the vacuum pump 36, a mixed gas was introduced into the chamber 30. The mixed gas herein contained helium and hydrogen, and its hydrogen concentration was about 4%. Subsequently, degassing and introduction of the mixed gas were repeated three times to substantially remove the nitrogen gas inside the chamber 30.

After the chamber 30 was filled with a predetermined gas, high voltage at high frequency was applied between the electrode 21a and the electrode 21b under Condition 5 in EXAMPLE 1 to cause ionization of at least part of the mixed gas. With the hydrogen ionized gas in which plasma was generated, the surface was treated for ten minutes. Then, the amount of hydrogen present in the treated substrate was analyzed by secondary ion mass spectrometry, and the degree of the presence of the caused bonding defects was compared between before and after the hydrogenation.

Figure 24:
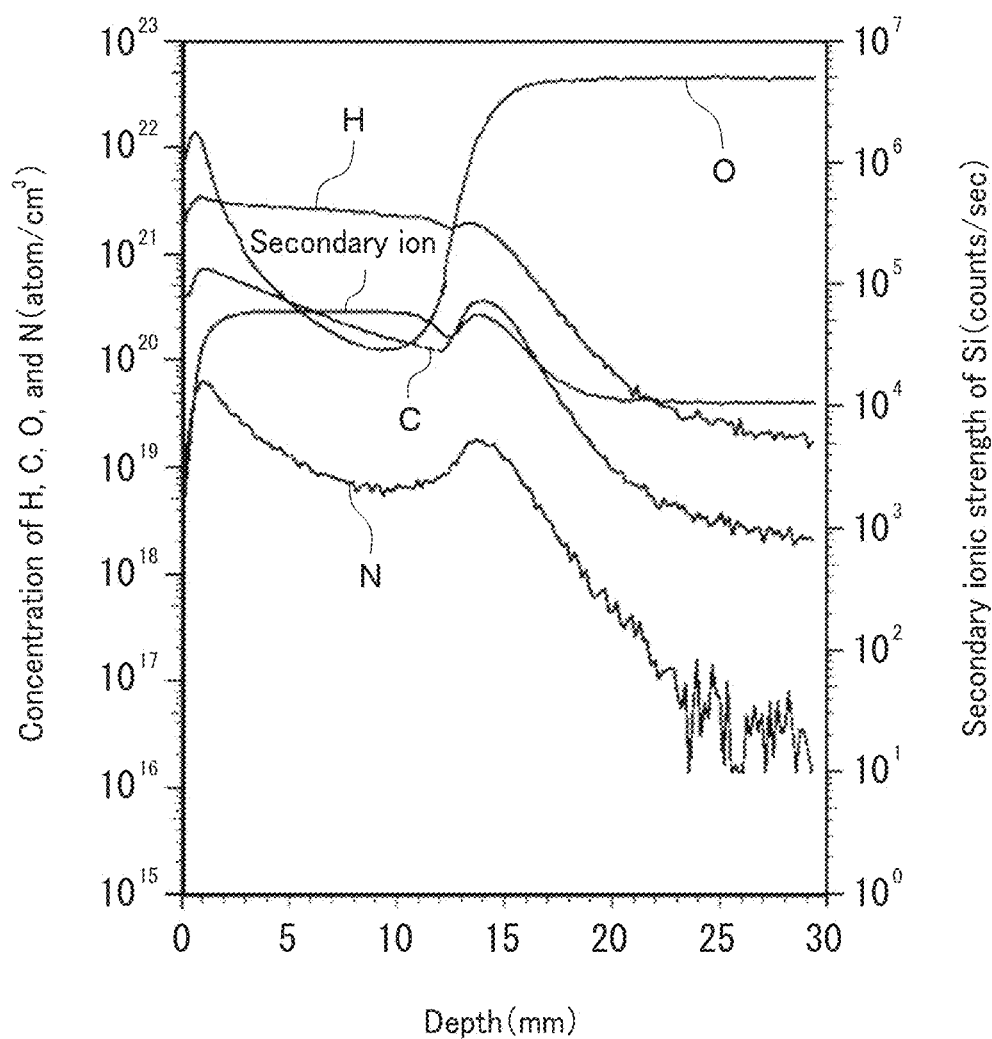
FIG. 24 is a graph representation showing the results of secondary ion mass spectrometry analysis of element distributions in depth direction performed on an amorphous silicon film before hydrogenation.
Figure 25:
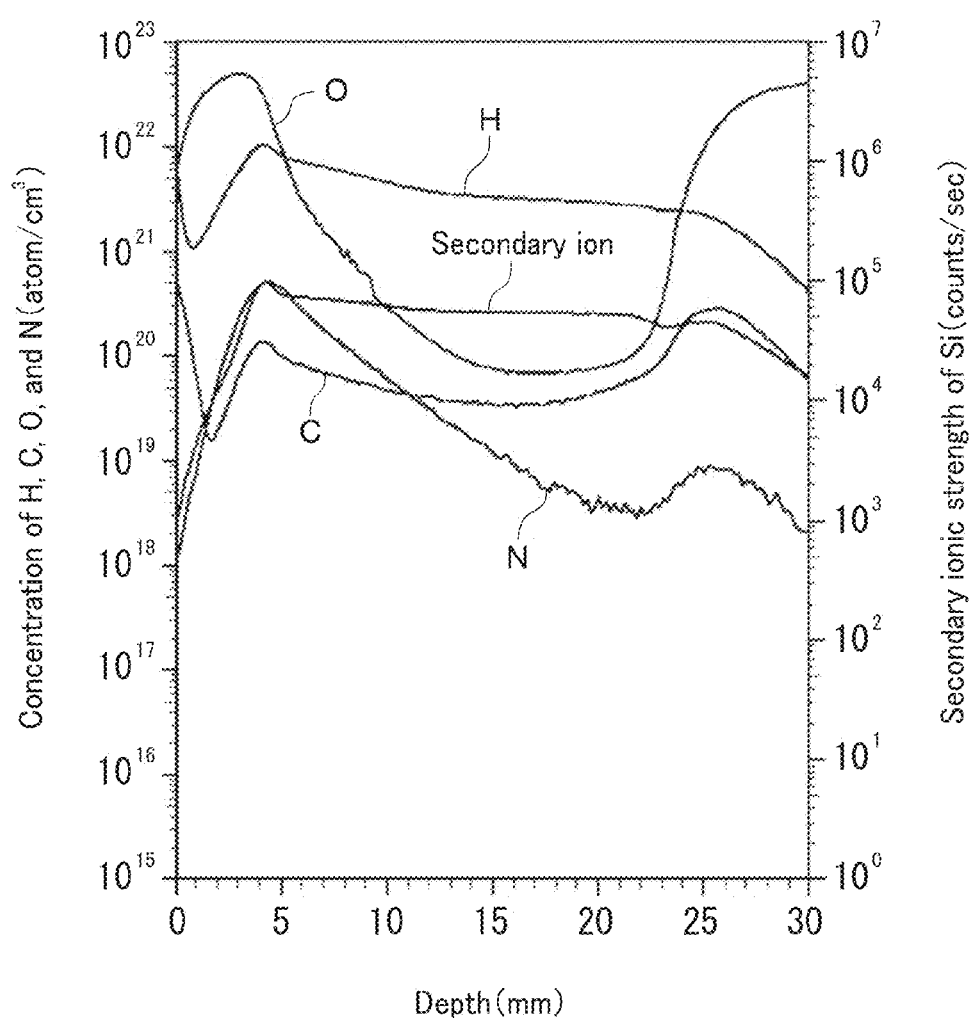
FIG. 25 is a graph representation showing the results of secondary ion mass spectrometry analysis of element distributions in depth direction performed on the amorphous silicon film after hydrogenation.

FIG. 24 shows the results of element analysis in the depth direction of the substrate before the hydrogenation. FIG. 25 shows the results of element analysis in the depth direction of the substrate after the hydrogenation. The hydrogen distribution in the thickness direction in the substrate before the hydrogenation was about $2 \times 10^{21}$ (atoms/cm$^3$) or lower. On the other hand, the hydrogen distribution in the thickness direction in the substrate after the hydrogenation was increased to about $6.5 \times 10^{21}$ (atoms/cm$^3$). In view of this, it was clarified that the hydrogenation could increase the content in the substrate when compared with that before the hydrogenation.

Example 8

Hydrosilane synthesized by the aforementioned method was dissolved into a cyclopentadiene solution and was prepared to have a concentration of 10 wt %. Then, the solution of 2.5 mL was put into a quartz vessel. Thereafter, light which shows a strong peak at a wavelength of around 300 nm was irradiated to the solution for five seconds with a high-pressure mercury-vapor lamp (4000 mW/cm$^2$) while stiffing the solution, thereby causing cross-linking of polysilane. After the cross-linking, the cross-lined polysilane was spin coated onto a quartz substrate, was held at a temperature of 450° C. for one hour in a nitrogen atmosphere, thereby forming an amorphous silicon film S. In that time, hydrogen in the amorphous silicon film S was removed to produce bonding defects.

Next, the substrate on which the amorphous silicon film S was formed was placed onto a hotplate for thermal treatment to perform temporary baking on the amorphous silicon film S. Then, the amorphous silicon film S was placed on the ground electrode 21b.

After the chamber 30 was sealed, and the gas inside the chamber 30 was removed (degassed) using the vacuum pump 36, a mixed gas was introduced into the chamber 30. The mixed gas herein contained helium and hydrogen, and its hydrogen concentration was about 4%. Subsequently, degassing and introduction of the mixed gas were repeated three times to substantially remove the nitrogen gas inside the chamber 30.

After the chamber 30 was filled with a predetermined gas, high voltage at high frequency was applied between the electrode 21a and the electrode 21b under Condition 5 in EXAMPLE 1 to cause ionization of at least part of the mixed gas. With hydrogen ionized air in which plasma was generated, the surface was treated for ten minutes. Then, the crystalline state of the obtained substrate was analyzed by Raman spectroscopy.

Figure 26:
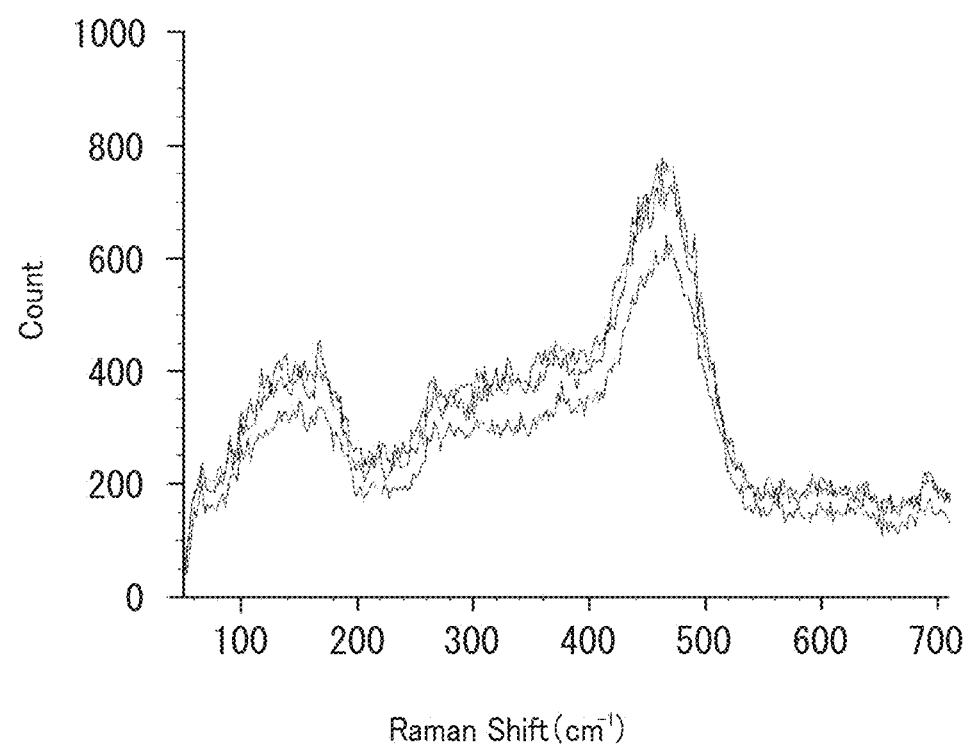
FIG. 26 is a graph representation showing measurement results by Raman spectroscopy on amorphous silicon films before hydrogenation.
Figure 27:
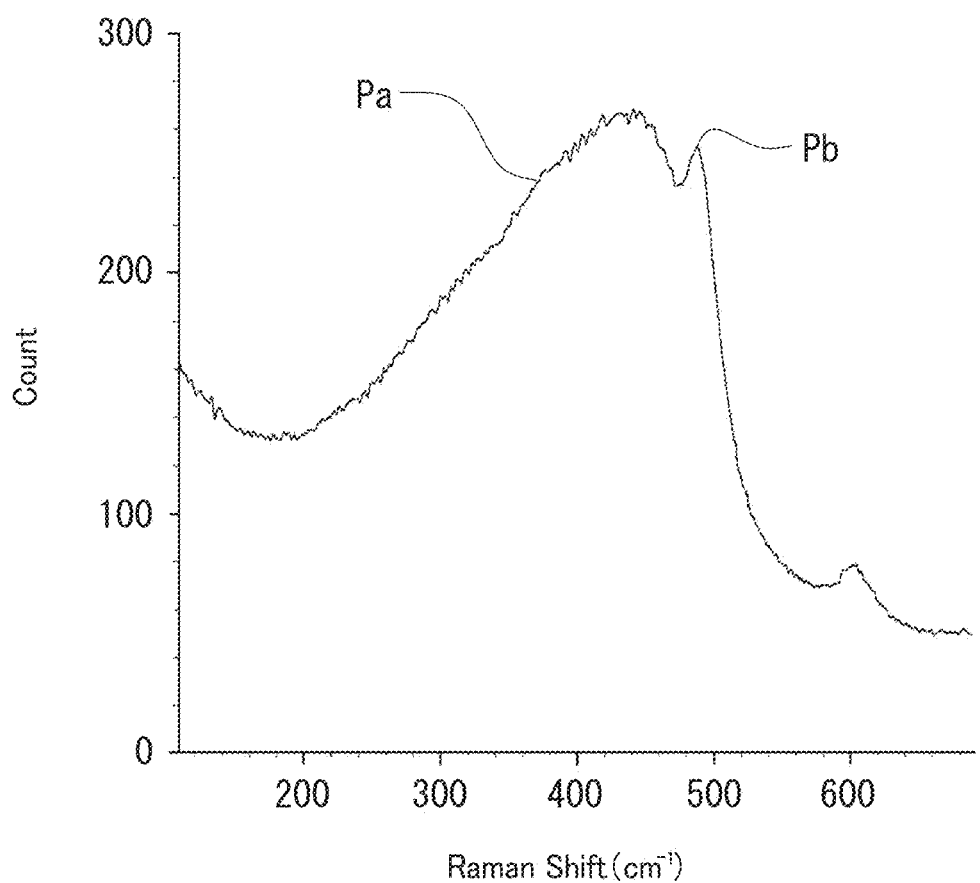
FIG. 27 is a graph representation showing measurement results by Raman spectroscopy after hydrogenation.

FIG. 26 shows the measurement results by Raman spectroscopy before the hydrogenation. FIG. 27 shows the measurement results by Raman spectroscopy after the hydrogenation. While a peak derived from amorphous silicon appeared at around 450 cm$^{-1}$ before the hydrogenation, the hydrogenation caused a peak Pb derived from crystalline silicon to appear at around 500 cm$^{-1}$ in addition to the peak Pa derived from amorphous silicon.

[Measurement by Electron Spin Resonance (ESR)]

Figure 28:
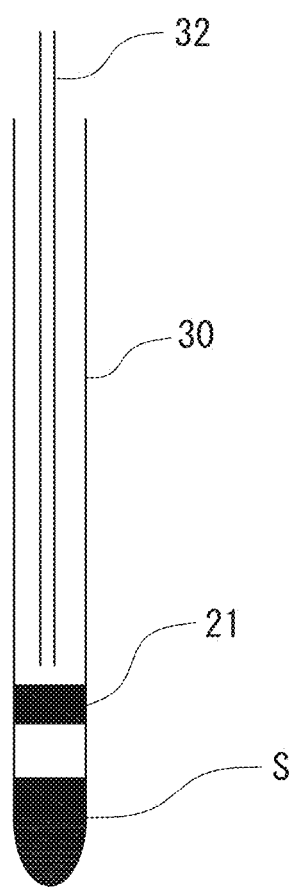
FIG. 28 is a schematic illustration for explaining measurement by electron spin resonance.

Silicon ink (10% solid content) of 2004, was poured into an ESR test tube inside a glove box (0.1 ppm or lower oxygen concentration and 1 ppm or lower moisture content). Then, as shown in FIG. 28, the gas supply pipe 32 was set above (about 3 mm above) the silicon ink within the ESR test tube 30, and a mixed gas containing a helium gas and a hydrogen gas was introduced therein. The mixed gas was introduced at a rate of about 10 mL/min, and the concentration of the hydrogen gas was about 4%.

A conductive tape 21 with a width of about 5 mm was wound to the ESR test tube 30 at a level of the tip end of the gas supply pipe 32, and a high voltage electrode was connected to the conductive tape 21 to apply an alternating voltage of 10 kV at a frequency of 10 kHz. After plasma generation accompanied by voltage application was recognized within the ESR test tube 30, plasma generation was allowed to continue at the room temperature for ten minutes. Then, the ESR test tube 30 was moved to a baking furnace with plasma generation continued. Thereafter the temperature was raised over one hour from the room temperature to 100° C., and then, baking was further continued for one hour with the temperature kept at 100° C. Subsequently, the temperature was raised over one hour up to 450° C. When the temperature reached 450° C., it was maintained at 450° C. for one hour and was then lowered to the room temperature by natural cooling. When the temperature became 100° C., plasma generation was stopped, and the temperature was further lowered to the room temperature by natural cooling. It is noted that the ESR test tube 30 stood upright in baking to avoid scattering by bumping. After solidification of silicon at the bottom of the ESR test tube 30 was recognized, bonding defects (dangling bonds) remaining in the silicon was measured by an electron spin resonance spectrometer.

Figure 29:
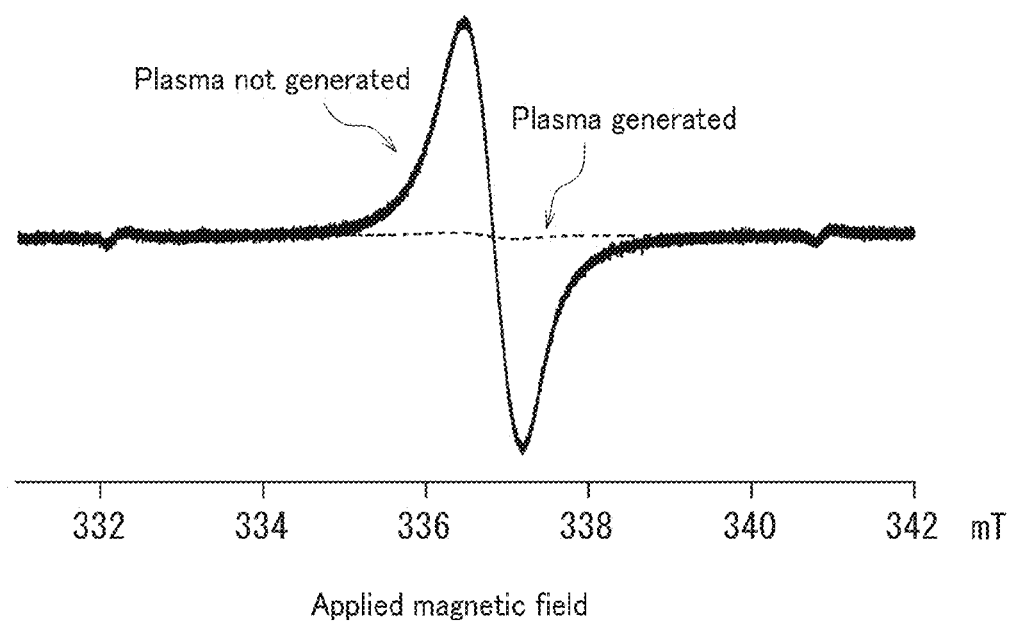
FIG. 29 is a graph representation showing measurement results by electron spin resonance.

FIG. 29 shows the results measured by ESR. Absorption of microwaves by dangling bonds corresponds to an applied magnetic field of 337 mT. For comparison, FIG. 29 shows the measurement result where no plasma was generated in combination. Further, the applied magnetic field corresponding to a manganese marker for plasma corresponds to 332 mT and 341 mT. In FIG. 29, the degree of absorption by the manganese marker is shown so as to be equivalent between the presence and the absence of plasma generation. It can be understood from FIG. 29 that plasma generation could significantly reduce bonding defects.

INDUSTRIAL APPLICABILITY

According to the present invention, bonding defects of an amorphous silicon film can be eliminated. This amorphous silicon film can be used suitably for semiconductor devices Reference Sign List 10 hydrogenation apparatus
20 plasma generation section
21x ionized gas generation section
21a first electrode
21b second electrode
22 dielectric
22a first dielectric
22b second dielectric
24 spacer
30 hermetic member

The invention claimed is:

1. A hydrogenation method comprising:
preparing a plasma generation section;
preparing a hermetic member;
supplying a gas containing a hydrogen gas to the hermetic member;
disposing an amorphous silicon film inside the hermetic member; and
performing plasma treatment on the amorphous silicon film in a manner that the plasma generation section allows a gas at a pressure around an atmospheric pressure containing the hydrogen gas to generate plasma in at least a partial region inside the hermetic member, wherein
the supplying is performed before the amorphous silicon film is disposed, and
the disposing an amorphous silicon film includes forming the amorphous silicon film inside the hermetic member to which the gas containing the hydrogen gas is supplied.

2. The hydrogenation method of claim 1, wherein
the disposing an amorphous silicon film includes forming the amorphous silicon film inside the hermetic member with the use of a solution in which a silane compound is dissolved.

3. The hydrogenation method of claim 1, further comprising:
disposing the plasma generation section inside the hermetic member.

4. The hydrogenation method of claim 1, wherein
the disposing an amorphous silicon film includes forming the amorphous silicon film inside the hermetic member with the use of the solution in which the silane compound is dissolved after the gas containing the hydrogen gas is supplied, and
in the performing plasma treatment, the plasma is allowed to be generated without changing the gas inside the hermetic member at the time when the amorphous silicon film is formed.

5. The hydrogenation method of claim 1, further comprising:
performing temporary baking on the amorphous silicon film.

6. The hydrogenation method of claim 1, wherein
in the performing plasma treatment, the gas is a mixed gas containing the hydrogen gas and an inert gas.

7. The hydrogenation method of claim 6, wherein
in the mixed gas, the hydrogen gas has a concentration of 0.1 weight % or higher.

8. The hydrogenation method of claim 6, wherein
the mixed gas contains a gas containing a p-type impurity element or an n-type impurity element.

9. The hydrogenation method of claim 6, wherein
the mixed gas contains any of diborane, phosphine, and arsine.

10. The hydrogenation method of claim 1, wherein
in the preparing a plasma generation section, the plasma generation section includes a first electrode and a second electrode.

11. The hydrogenation method of claim 10, wherein
in the preparing a plasma generation section, one of the first electrode and the second electrode is grounded.

12. The hydrogenation method of claim 10, wherein
in the preparing a plasma generation section, the amorphous silicon film is disposed between the first electrode and the second electrode.

13. The hydrogenation method of claim 10, wherein
in the performing plasma treatment, the amorphous silicon film is moved so as to pass between the first electrode and the second electrode in generating the plasma.

14. The hydrogenation method of claim 10, wherein
the performing plasma treatment includes sliding the amorphous silicon film so as to pass between the first electrode and the second electrode.

15. The hydrogenation method of claim 10, wherein
in the performing plasma treatment, the plasma is generated between the first electrode and the second electrode in a state where the gas inside the hermetic member flows so as to pass between the first electrode and the second electrode and reach the amorphous silicon film.

16. The hydrogenation method of claim 10, wherein
at least one of the first electrode and the second electrode is a linear electrode including two or more conductive parts extending in stripes, and
the conductive parts have a bulk shape or a mesh-like shape.

17. The hydrogenation method of claim 10, wherein
in the preparing a plasma generation section, a dielectric is mounted at at least one of the first electrode and the second electrode.

18. The hydrogenation method of claim 17, wherein
the dielectric is made of an inorganic material or an organic material.

19. The hydrogenation method of claim 18, wherein
the inorganic material includes glass, alumina, or apatite.

20. The hydrogenation method of claim 18, wherein
the organic material includes polyimide, polyoxymethylene, or novolac resin.

21. The hydrogenation method of claim 17, wherein
at least one of the first electrode and the second electrode is a linear electrode including two or more conductive parts extending in stripes.

22. The hydrogenation method of claim 21, wherein
the conductive parts have a bulk shape or a mesh-like shape.

23. The hydrogenation method of claim 17, wherein
in the preparing a plasma generation section, the dielectric is mounted at one of the first electrode and the second electrode.

24. The hydrogenation method of claim 17, wherein
the second electrode is grounded,
the dielectric includes a dielectric plate mounted at the first electrode, and
the first electrode is arranged opposite to the second electrode with the dielectric plate interposed therebetween.

25. The hydrogenation method of claim 17, wherein
either the first electrode or the second electrode is disposed 0.5 mm or more apart from the amorphous silicon film.

26. The hydrogenation method of claim 17, wherein
in the preparing a plasma generation section, the dielectric includes a first dielectric mounted at the first electrode and a second dielectric mounted at the second electrode.

27. The hydrogenation method of claim 26, wherein
the first dielectric includes a first dielectric plate, and the second dielectric includes a second dielectric plate,
the second electrode is grounded,
a spacer made of a dielectric material is provided between the first dielectric plate and the second dielectric plate, and
the amorphous silicon film is disposed 0.5 mm or more apart from the first dielectric plate.

28. The hydrogenation method of claim 26, wherein
the first electrode includes a rod-shaped electrode surrounded by and covered with the first dielectric,
the first dielectric is made of an organic insulating material,
the second electrode includes a metal plate or a metal mesh fixed at the bottom of the second dielectric,
the second electrode is grounded,
the amorphous silicon film is disposed between the first electrode and the second electrode, and
the amorphous silicon film is arranged 0.5 mm or more apart from the first electrode.

29. The hydrogenation method of claim 17, wherein
the second electrode is grounded,
the dielectric is mounted at only the first electrode, and
the first electrode is arranged opposite to the second electrode with the dielectric interposed therebetween.

30. The hydrogenation method of claim 17, wherein
the first electrode and the second electrode are disposed on the dielectric, and each of the first electrode and the second electrode is covered with an organic material.

31. The hydrogenation method of claim 10, wherein
the first electrode is arranged opposite to the second electrode with no dielectric interposed therebetween.

32. The hydrogenation method of claim 10, wherein
the performing plasma treatment includes applying alternating voltage between the first electrode and the second electrode.

33. The hydrogenation method of claim 32, wherein
the alternating voltage is 25 volts or higher and 100 kilovolts or lower and has a frequency of 60 hertz or higher and 1 megahertz or lower.

34. The hydrogenation method of claim 32, wherein
the alternating voltage has a waveform of any of a sine wave, a triangular wave, and a rectangular wave.

35. The hydrogenation method of claim 1, wherein
the performing plasma treatment includes heating the amorphous silicon film with a heater.

36. The hydrogenation method of claim 1, wherein
the performing plasma treatment includes setting the amorphous silicon film in a range between minus 30° C. and 900° C.

37. The hydrogenation method of claim 1, wherein
in the performing plasma treatment, a crystalline state of the amorphous silicon film is controlled according to an ionized gas density.

38. The hydrogenation method of claim 1, wherein
in the preparing a plasma generation section, the plasma generation section includes a coil.

39. The hydrogenation method of claim 1, wherein
in the preparing a plasma generation section, the plasma generation section includes a microwave generation section and an antenna.

40. A hydrogenation method comprising:
preparing a plasma generation section;
preparing a hermetic member;
disposing an amorphous silicon film inside the hermetic member; and
performing plasma treatment on the amorphous silicon film in a manner that the plasma generation section allows a gas at a pressure around an atmospheric pressure containing a hydrogen gas to generate plasma in at least a partial region inside the hermetic member, wherein
in the performing plasma treatment, the gas is a mixed gas containing the hydrogen gas and an inert gas, and
the mixed gas contains a gas containing a p-type impurity element or an n-type impurity element.

41. The hydrogenation method of claim 40, wherein
in the mixed gas, the hydrogen gas has a concentration of 0.1 weight % or higher.

42. The hydrogenation method of claim 40, wherein
the mixed gas contains any of diborane, phosphine, and arsine.

43. A hydrogenation method comprising:
preparing a plasma generation section;
preparing a hermetic member;
disposing an amorphous silicon film inside the hermetic member; and
performing plasma treatment on the amorphous silicon film in a manner that the plasma generation section allows a gas at a pressure around an atmospheric pressure containing a hydrogen gas to generate plasma in at least a partial region inside the hermetic member, wherein
in the preparing a plasma generation section, the plasma generation section includes a first electrode and a second electrode, and
in the preparing a plasma generation section, a dielectric is mounted at at least one of the first electrode and the second electrode.

44. The hydrogenation method of claim 43, wherein
the dielectric is made of an inorganic material or an organic material.

45. The hydrogenation method of claim 44, wherein
the inorganic material includes glass, alumina, or apatite.

46. The hydrogenation method of claim 44, wherein
the organic material includes polyimide, polyoxymethylene, or novolac resin.

* * * * *